is

(12) United States Patent
Wong

(10) Patent No.: US 10,942,219 B2
(45) Date of Patent: Mar. 9, 2021

(54) CIRCUIT ARRANGEMENT FOR SWITCHING NOISE JITTER (SNJ) REDUCTION IN FEEDBACK CONTROL LOOP CIRCUITS, AND METHODS OF MAKING THE SAME

(71) Applicant: TransSiP, Inc., Irvine, CA (US)

(72) Inventor: Chih Wei Wong, Irvine, CA (US)

(73) Assignee: TRANSSIP, INC., Irvine, CA (US)

( * ) Notice: Subject to any disclaimer, the term of this patent is extended or adjusted under 35 U.S.C. 154(b) by 287 days.

(21) Appl. No.: 16/125,046

(22) Filed: Sep. 7, 2018

(65) Prior Publication Data

US 2019/0064264 A1 Feb. 28, 2019

Related U.S. Application Data

(63) Continuation of application No. PCT/US2017/023268, filed on Mar. 21, 2017.
(Continued)

(51) Int. Cl.
| | |
|---|---|
| *H02M 1/44* | (2007.01) |
| *G01R 31/317* | (2006.01) |
| *H02M 3/156* | (2006.01) |
| *H02M 3/158* | (2006.01) |
| *H02M 1/14* | (2006.01) |
| *H03M 1/08* | (2006.01) |

(Continued)

(52) U.S. Cl.
CPC ........ *G01R 31/31709* (2013.01); *H01P 1/227* (2013.01); *H02M 1/143* (2013.01); *H02M 1/44* (2013.01); *H02M 3/156* (2013.01); *H02M 3/158* (2013.01); *H03M 1/0836* (2013.01); *H02M 2001/0054* (2013.01)

(58) Field of Classification Search
CPC .. G01R 31/31709; H02M 1/44; H02M 1/143; H02M 3/156
See application file for complete search history.

(56) References Cited

U.S. PATENT DOCUMENTS

| | | |
|---|---|---|
| 4,435,689 A | 3/1984 | McDowell |
| 6,453,157 B1 | 9/2002 | Roberts |
(Continued)

OTHER PUBLICATIONS

Wu et al., Impact of PWM Jitter to Switching-Mode Power Converter Efficiency, Oct. 17, 2013, 2013 15th European Conference on Power Electronics and Applications (EPE), Lille, France, 8 pp. (Year: 2013).*

(Continued)

*Primary Examiner* — Toan M Le
(74) *Attorney, Agent, or Firm* — Servilla Whitney LLC

(57) ABSTRACT

A circuit arrangement and methods for reducing a switching noise jitter signature in an output signal of a feedback control loop circuitry are disclosed. The passive signal conditioning means including the rails is closely coupled to the common connection junction and is characterized by a set of specified characteristics to condition pre-existing noise amplitude and slopes of the output signal so as to improve the interactions between the output signal and the feedback control loop circuitry. As a consequence, the switching noise jitter signature, which is produced by transient noise displacement or noise perturbation in the time domain when the output signal jitters, can be reduced in the output of the feedback control loop circuitry.

53 Claims, 13 Drawing Sheets

Related U.S. Application Data

(60) Provisional application No. 62/310,673, filed on Mar. 19, 2016.

(51) Int. Cl.
  *H01P 1/22* (2006.01)
  *H02M 1/00* (2006.01)

(56) References Cited

U.S. PATENT DOCUMENTS

| | | |
|---|---|---|
| 2008/0253054 A1 | 10/2008 | Anthony et al. |
| 2008/0258701 A1 | 10/2008 | Liu et al. |
| 2013/0249505 A1 | 9/2013 | Brown et al. |
| 2014/0292300 A1 | 10/2014 | Yan |
| 2018/0054110 A1 | 2/2018 | Lim et al. |
| 2019/0064264 A1 | 2/2019 | Wong |

OTHER PUBLICATIONS

Abstract of Wu et al., Oct. 17, 2013, 1 pp. (Year: 2013).*
PCT International Search Report in PCT/US2017/023268, dated Jun. 5, 2017, 1 pg.
PCT Written Opinion in PCT/US2017/023268, dated Jun. 5, 2017, 6 pgs.
Non-Final Office Action in U.S. Appl. No. 16/125,068, dated Apr. 3, 2020, 22 pages.

\* cited by examiner

CIRCUIT ARRANGEMENT FOR SWITCHING NOISE JITTER (SNJ) REDUCTION IN FEEDBACK CONTROL LOOP CIRCUITS, AND METHODS OF MAKING THE SAME

CROSS REFERENCE TO RELATED APPLICATIONS

This application is a continuation of International Application Serial No. PCT/US2017/023268 filed on Mar. 21, 2017, which claims the benefit of priority under 35 USC § 119(e) to U.S. Provisional Patent Application No. 62/310,673 filed on Mar. 19, 2016, which are incorporated herein by reference in their entireties.

BACKGROUND OF THE INVENTION

Field of the Invention

This invention provides a circuit arrangement for reducing a time domain noise signature (switching noise jitter (SNJ) signature) of control circuits that include negative feedback loops which may be applied to switching mode DC-DC converters, particularly those DC-DC converters that include pulse frequency modulation (PFM) types of conversion, thereby improving the performance of noise-sensitive circuits and electronics systems connected thereto, the SNJ signature being detrimental to the signal integrity of the noise-sensitive applications.

Related Art

DC-DC converters are components critical to the performance of modern electronic systems. In the majority of power-constrained portable and wearable applications embodying wireless connectivity including location based services, DC-DC converters provide constant DC supply bias voltages converted from an energy source such as a battery to match the operating requirements of the components therein. DC-DC converters are classified into two types. The first type are linear regulators or low drop out (LDO) regulators. Linear regulators provide substantially low supply bias noise perceived by the powered circuit elements, however, at the expense of low conversion efficiency which leads to shorter battery life. The second type are switching mode DC-DC converters which provide substantially higher conversion efficiency than linear regulators, however, at the expense of higher supply bias noise perceived by the powered circuit elements.

Although it is a continuing goal in the industry to improve conversion efficiency and noise with both types of DC-DC converters, tradeoffs always exist between switching mode DC-DC converters and linear regulators in conversion efficiency and supply bias noise. For instance, when passing a regulatory requirement is needed or an optimum golden standard is required to build a noise-sensitive electronic system such as RF and microwave circuits, timing circuit, analog-to-digital converter, integrator, convolution of digital communication signals, etc., most circuit designers opt for less-efficient linear regulators (or LDOs) to power the electronic system. Use of switching mode DC-DC converters is typically referenced as alternatively functional choices for getting longer battery life or better power saving but compromises on system performance and product specification are expected.

FIG. 1 illustrates a prior art of a conventional switching mode DC-DC converter circuit topology in which the circuit topology converts a first DC voltage present on the input rail (VIN) 100 to a second DC voltage on the output rail 140. The circuit topology is comprised of two fundamental functional blocks—a switching block 110 and averaging filter 120. The switching block 110 contains a feedback control loop circuitry 112 which decides when to turn on and off the MOSFET drivers 114 and 116 according to the DC output voltage conditions on the output rail 140, which is connected to the feedback node 104, whether at steady-state or in the presence of changing load conditions on the load 150. The amount of on-time and off-time of the MOSFET drivers 114 and 116 is provided by a modulator within the control loop circuitry 112, the output of which is presented at the switching node (SW) 102 as a pulse train voltage waveform 132 on the rail 130 connected between the switching node 102 and averaging filter 120. In order to obtain a constant and smooth DC output voltage on the output rail 140, a low-pass averaging filter 120 comprised of a power inductor L 122 and a decoupling capacitor C 124 connected as shown in FIG. 1 has to be connected between rail 130 and output rail 140. The averaging filter 120 passes the DC components of the pulse train voltage waveform 132 and rejects the AC components and noise consisting of the pulse train voltage waveform 132 at the switching frequency and its harmonics. Incompletely attenuated AC components and noise appear as ripple voltage 142 and noise 149 on the output rail 140, and the ripples consist in the time domain of an increasing voltage (up-slope) ramp 144 and decreasing voltage (down-slope) ramp 146 with a period equivalent to the switching frequency of the modulator in the control loop circuitry 112. The MOSFET drivers 114 and 116 are toggled between on-state and off-state when the increasing voltage ramp 144 rises or the decreasing voltage ramp 146 drops to a switching decision threshold defined by a predetermined reference source in the control loop circuitry 112, thereby providing a stable and regulated DC output voltage on the output rail 140.

However, no feedback control loop circuitry 112 is noise-free. Noise 119 exists in the feedback control loop circuitry 112 with the result that it makes the switching decision threshold 118 non-ideal such that the switching decision threshold is essentially a decision region formed between the noise 119 and the switching decision threshold 118. When the ramp signals 144 and 146 approach the non-ideal decision region, either a small amount of noise 149 carried by the ramp signals 144 and 146 or noise 119 carried by the switching decision threshold in control loop circuitry 112 is enough to trigger the MOSFET drivers to change state, and as a consequence this will take place earlier or later in time. This probabilistic variation in the decision region induces some variability 138 in the on-times 134 and off-times 136 of the pulse train voltage waveform 132 present at the switching node 102, causing the output ripple voltage 142 to ramp up and ramp down earlier or later compared to a steady state reference. This variability in the output ripple voltage 142 is referred to as "jitter" 148. Jitter present in the output ripple voltage is generally considered in the prior art as an inhibitor to the conversion efficiency of switching mode DC-DC converters.

In recent years, low equivalent series resistance (low-ESR) multilayer ceramic chip capacitors (MLCCs) 124 have become the preferred choice for decoupling capacitor or capacitors used within the output averaging filter 120 due to the fact that new developments in switching mode DC-DC converters enable the use of low-ESR decoupling capacitors.

Using a low-ESR MLCC 124 within the output averaging filter 120 offers the advantage of producing smaller ripple voltage amplitude, thereby reducing potential interference perceived by the circuit elements powered by the switching mode DC-DC converters. Low-ESR capacitors are also made with different dielectric materials for high power or high voltage applications, such as solid polymer aluminum electrolytic, liquid and solid polymer aluminum electrolytic, and polymer cathode tantalum electrolytic, thereby becoming widely used in industry within switching mode DC-DC converter topologies to minimize ripple voltage amplitude. Most capacitors stated above are physically constructed with two terminals such that one terminal is connected to the DC output rail 140 and the other terminal is connected to the ground or reference potential 160. In addition, when more rejection is needed to cover a broader range of high frequencies of the AC components and noise consisting of the pulse train voltage waveform 132, one common method is to use a ladder topology of low-ESR MLCCs consisting of different capacitance values which are connected in parallel at the DC-DC output rail 140. Similarly to the method stated above, use of ceramic capacitors incorporating 4 terminals, which have been introduced in recent years, is an alternative method to replace the ladder topology of low-ESR MLCCs. Such ceramic capacitors are marketed as X2Y attenuators, Chip 3-Terminal capacitors, 3-terminal chip filters, or other names in common use in the marketplace.

FIG. 2 (prior art) illustrates the schematic symbols of two types of 4-terminal ceramic capacitors, and their respective physical appearances. One is denoted as X2Y attenuators 200 and the other is denoted as Chip 3-Terminal capacitors 210. These 4-terminal ceramic capacitors are constructed with two ground terminals (G1 202 and G2 204 on the X2Y attenuators or ground electrodes 212 and 214 on the Chip 3-Terminal capacitors) on each lateral side of the capacitors and two other terminals (A 206 and B 208 on the X2Y attenuators or feedthrough electrodes 216 and 218 on the Chip 3-Terminal capacitors) on each of the ends of the capacitors. A typical way to compare the usage of 4-terminal ceramic capacitors and low-ESR MLCCs is to compare the insertion loss across frequencies.

An example as shown in FIG. 3 (prior art) compares the insertion loss of a 4-terminal ceramic capacitor represented by curve 310 to a low-ESR MLCC having the same capacitance represented by the curve 320. The 4-terminal ceramic capacitor has a higher self-resonant frequency (SRF) 314 at a frequency of about 10.5 MHz while the low-ESR MLCC has a lower SRF 324 at about 4 MHz. With regard to rejection of high frequencies, the 4-terminal ceramic capacitor is about 22 dB more 330 than the standard MLCC across frequencies above the SRF 324. In terms of attenuation bandwidth in which about 50 dB attenuation 332 is provided, the 4-terminal ceramic capacitor covers a wider frequency range 312 of 1 MHz-200 MHz while the low-ESR MLCC covers a narrower frequency range 322 of 1 MHz-11 MHz. However, with regard to rejection for low frequencies, such as below the SRF 324 of the MLCC or below 1 MHz, low-ESR MLCC and the 4-terminal ceramic capacitor demonstrate similar characteristics as shown by range 334 in FIG. 3.

Nowadays, the operation of billions of wireless electronic systems including smartphones, smartwatches, Internet-of-Things (IoT) and other wireless connectivity devices includes power-saving modes to minimize power consumption or to maximize battery life. The current drain in power-saving modes is pulsed in nature: these devices may briefly enter a high-power active state (e.g. RF On) for only a few to tenths of milliseconds while most of the time is spent in low-power states lasting tenths to tens of seconds. The average current consumption of power saving modes may be only tens of micro amps or roughly one percent of full load. Thus these devices are "light load" and operated in the presence of pulsed load conditions.

Therefore, a need exists for a DC-DC converter which can deliver high conversion efficiency from light load to full load and simultaneously provides low supply bias noise under the influence of the pulsed load conditions.

Pulse frequency modulation (PFM) types of switching mode DC-DC converters are considered capable of delivering high conversion efficiencies from light load to full load. However, supply bias noise from PFM DC-DC conversion is always regarded as chaotic with the result that PFM DC-DC converters are avoided by most designers concerned with noise-sensitive RF, microwave and analog circuits, and critical signal processing functions in modern wireless communication systems. Hybrid DC-DC converters incorporating a combination of pulse width modulation (PWM) and PFM modulators have been designed to improve noise characteristics by the PWM conversion at full load while maintaining high conversion efficiency by the PFM conversion at light load.

However, switching between these two modes leads to heightened load regulation transient responses and voltage drops during transitions. I have found these drawbacks are further exacerbated under the influence of pulsed load conditions because of the need for mode switching when entering or leaving power saving modes, while single mode PFM DC-DC converters don't have these problems.

If the chaotic noise problems of PFM DC-DC conversion could be solved, a whole new generation of wireless, portable, wearable and IoT devices would benefit from significantly improved battery life and enhanced user experience without compromising maximum wireless and system performance. As a consequence, the prior art involving the use of switched-mode DC-DC power conversion and filters has been characterized by the problems of tradeoffs between conversion efficiency and supply bias noise outlined above.

SUMMARY OF THE INVENTION

Output noise associated with switching mode DC-DC converters consisting of ripple, switching frequency/frequencies and harmonics, ringing (due to parasitics), and spurious noise are well-defined and documented to those skilled in the art. However, the present invention reveals that there is another noise component in the time domain present in the output of switching mode DC-DC converters, particularly those that utilize PFM conversion, which interferes with the downstream circuit's ability to maintain optimum powered system performance. According to the present invention, it is also evident that after the amplitude of the output noise is brought down to a certain level, the amplitude of the noise will no longer be the dominant factor in degradation of downstream noise-sensitive circuit and systems performance.

The present invention further reveals that jitter or time variabilities generated by the control circuits (i.e. the negative feedback control loop) within a switching mode DC-DC converter modifies the output noise over time, thereby producing a new noise signature which compromises powered systems performance. Using a novel measurement technique incorporating real-time spectral histogram analysis tool available from Tektronix enabled the detection and capture of very short, varying interval transient events of the noise signature associated with noise displacement or noise perturbation in the time domain of supply bias noise characterized herein as "switching noise jitter" or "SNJ".

The present invention seeks to provide novel components, circuit topologies and associated methods for modifying the noise signature of control circuits and switching mode DC-DC converter circuits in which SNJ is a major contributor, particularly those circuits that include negative feedback loops and PFM conversions. This invention therefore enables the use of switching mode DC-DC converters in noise-sensitive circuits and electronics systems thereby achieving greater power conversion efficiencies and systems performance which is equal if not superior to that achieved by systems powered by linear regulators.

These goals are achieved, according to one embodiment of the invention, by providing a passive signal conditioning device comprising a substantial ESR coupled to a broadband attenuator. The passive signal conditioning device responds to an input alternating signal, increasing the slopes of the feedback signal ramps and decreasing the noise being carried thereon going into the control loop circuit and reducing time variability of the decision control (i.e. changing states from one to another) therein. The passive signal conditioning device reduces the amount of SNJ and overall noise characteristics on the output of the control circuit.

DC-DC converter circuits incorporating the disclosed passive signal conditioning device present unique characteristics in that they simultaneously provide the function of averaging filter as well as accomplish reductions in SNJ, high frequency noise and ripple amplitudes, thereby improving the overall supply bias noise. In the case of PFM DC-DC converters incorporating the disclosed passive signal conditioning device, the chaotic characteristics of supply bias noise represented by SNJ are no longer presented to powered circuit elements. Therefore the disclosed passive signal conditioning device in accordance with the present invention improves performance and noise of the output of PFM-type DC-DC converters. This enables use of PFM-type DC-DC converters to power noise-sensitive RF and microwave circuits and systems, as well as time domain functions such as clock circuits, oscillators, analog-to-digital converters, integrator, convolution of signals and the like. A further advantage of the present invention is the delivery of improved power conversion efficiency ranging from light load/standby to full load operation without degradation of overall supply bias noise and the stability of the regulated voltage under the influence of pulsed load conditions due to power saving operation modes.

The present invention will be more fully understood in light of the following detailed description taken together with the accompanying drawings.

SUMMARY OF ADVANTAGES

Accordingly several advantages of one or more aspects are as follows: to reduce both time domain noise signature (i.e. SNJ) and frequency domain noise in control circuits suitable for use in negative feedback control loop circuitries, thereby enabling use of PFM DC-DC converters in noise-sensitive applications with the result that substantially longer battery life and performance equal or superior to linear regulator-powered systems is provided, and that can be suitable for ultra-low power switching mode DC-DC converter designs in that additional active circuit elements for noise reduction are not required. Other advantages of one or more aspects will be apparent from a consideration of the drawings and ensuing description.

DRAWINGS

Non-limiting and non-exhaustive embodiments of the present invention are described with reference to the following drawings. In the drawings, like reference numerals refer to like parts throughout the various figures unless otherwise specified, in which:

FIG. 1 is a schematic diagram of a prior art switching mode DC-DC converter circuit topology and its output voltage waveforms;

FIG. 2 presents schematic symbols and exterior views of a prior art 4-terminal ceramic capacitors;

Figure 13A:
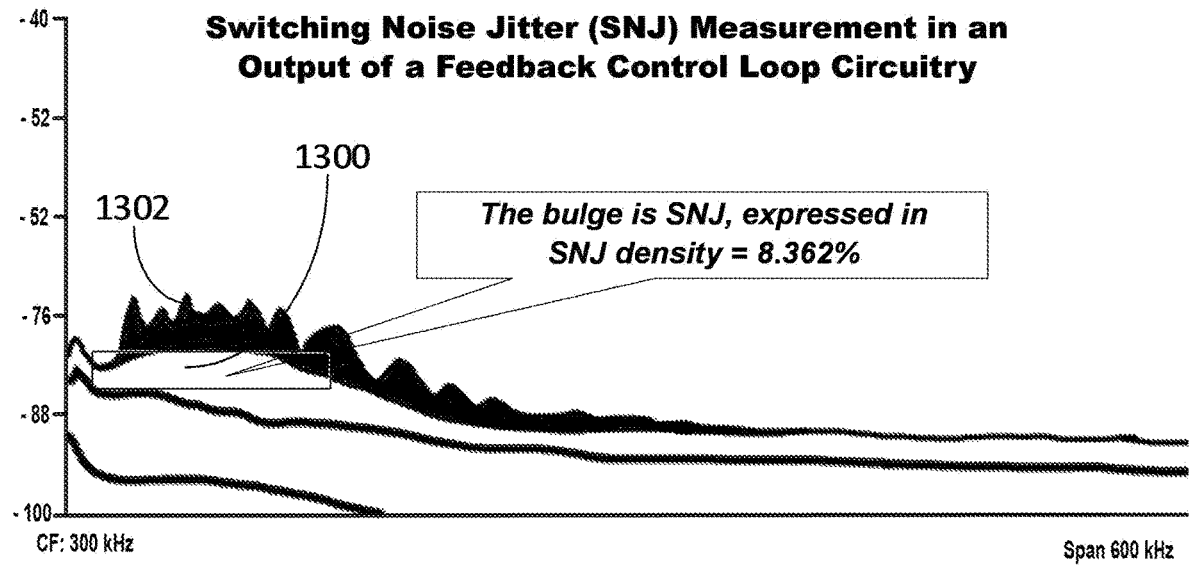
Figure 13B:
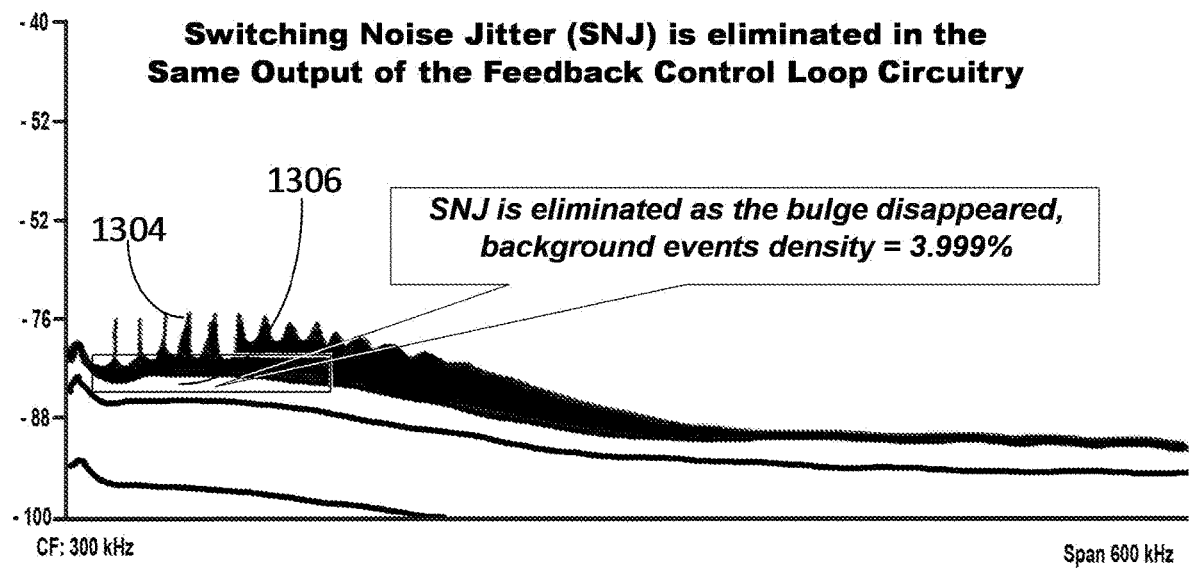

FIG. 13A is a graph showing the qualitative and quantitative measurement of SNJ present on output and feedback paths of a feedback control loop circuitry having a transistor switching stage switching an output signal at one or more predetermined frequencies; and FIG. 13B is a graph showing the same measurement as shown in FIG. 13A except the SNJ has been reduced at the output and feedback paths according to the present invention, notwithstanding the fact that the signal conditioned output signal still jitters.

DETAILED DESCRIPTION

Figure 1:
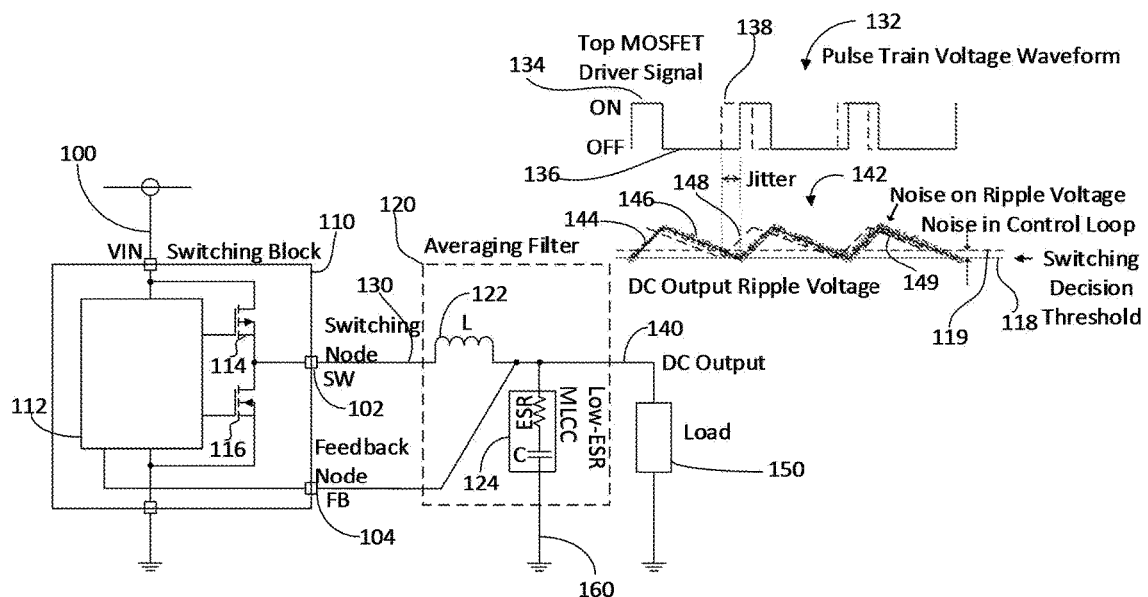
Figure 2:
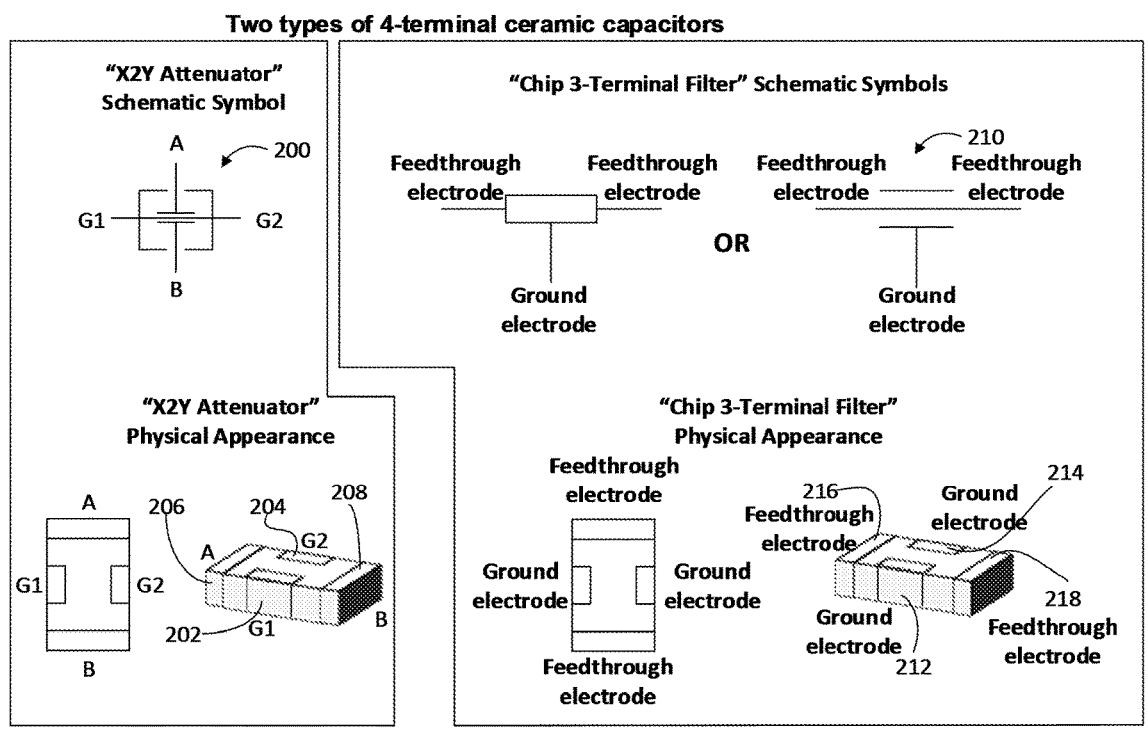

Construction of control circuits, averaging filters, and DC-DC converters using a passive signal conditioning device are described in the following description using specific language that has been briefly introduced in the previous section of BACKGROUND OF THE INVEN- TION and FIGS. 1, 2 and 3. Numerous specific details are set forth, such as circuit topology, circuit models, circuit functions, and circuit parameters, in order to provide a thorough understanding of embodiments of the present invention. Reference numbers may be repeated throughout the embodiments and Figures for properly indexing certain circuit parameters with respect to specific circuit elements. It will nevertheless be understood that the embodiments and examples are not intended to be limiting. Any alterations and modifications in the disclosed embodiments, and any further applications of principles disclosed in this document are contemplated as would normally occur to one of ordinary skill in the pertinent art. In other instances, well-known features, such as DC-DC converter operation, noise decoupling and filter topologies and methods, are not described in detail in order to not unnecessarily obscure embodiments of the present invention. Those of ordinary skill in the art will recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art. Additionally, it will be apparent to those skilled in the art that terms used herein that may include a whole, or a portion of a whole, such as "switching block", "control circuit", "averaging filter", "ripple", "output noise", "jitter", "conditioning", "broadband attenuator", "filter", and the like, are contemplated to include both the portions of the whole, and the entire of the whole, as used, unless otherwise noted.

Further, as used generally herein, a "rail" may be at least one, or a number of, conductive materials, for example, a conductive plane, an electrical wire, a via, an aperture, an individual conductive material portion such as a resistive lead, or an inductive lead, or an electrical plate, each one operable for sustained propagation of electrical current and voltage.

Furthermore, it is to be understood that the various embodiments shown in the Figures are illustrative representations and are not necessarily drawn to scale.

Output noise associated with switching mode DC-DC converters consisting of ripple, switching frequency/frequencies and harmonics, ringing (due to parasitics), and spurious noise are well-defined and documented to those skilled in the art. Since these are well known, they can easily be filtered and suppressed by decoupling capacitors or other methods known to those skilled in the art, in which there is a commonality that the methods are to suppress the amplitude of the output noise in the frequency domain. However, the present invention reveals that there is another noise component in the time domain present in the output of switching mode DC-DC converters, particularly those that utilize PFM conversion, which interferes with the downstream circuit's ability to maintain optimum system performance. According to the present invention, it is also evident that after the amplitude of the output noise is brought down to a certain level, even across a broad spectrum of frequencies, the amplitude of the noise is no longer the dominant factor in degradation of downstream circuit function, in particularly those with noise-sensitive RF and microwave circuits and systems, as well as time domain functions such as clock circuits, oscillators, analog-to-digital converters, integrator, convolution of signals and the like.

The present invention further reveals that the jitter or time variabilities generated by the control circuits (i.e. the negative feedback control loop) within a switching mode DC-DC converter modifies the output noise over time, thereby producing a new noise signature which compromises powered systems performance. Using a novel technique incorporating real-time spectral histogram analysis in the present invention enabled the detection and capture of very short, varying interval transient events of the noise signature associated with transient noise displacement or noise perturbation in the time domain of supply bias noise. This noise signature is characterized herein as "switching noise jitter" or "SNJ".

According to the present invention, it is also evident that after the output noise of a switching mode DC-DC converter is reasonably filtered and suppressed by methods as illustrated in the prior arts, SNJ will become a major noise component which compromises a powered systems performance. Further, according to the present invention, SNJ will exacerbate under the influence of pulsed load conditions if a system is operated in power-saving modes. FIG. 13A illustrates the existence of SNJ as a measureable bulge 1300 in the spectral histogram analysis on output and feedback paths of a feedback control loop circuitry having a transistor switching stage switching an output signal at one or more predetermined frequencies. The SNJ measurement is expressed in percentage as SNJ density which is approximately 8.4% in this example. Other than the SNJ (bulge 1300), conventional noise power 1302 with higher amplitudes is also captured on the top of the SNJ (bulge 1300) in the measurement as a result of the switching and jittering of the output signal.

The present invention seeks to provide novel components, circuit topologies and methods to reduce the chaotic characteristics of supply bias noise represented by SNJ in control circuits and switching mode DC-DC converters, particularly those that include negative feedback loops and PFM conversions.

Figure 4A:
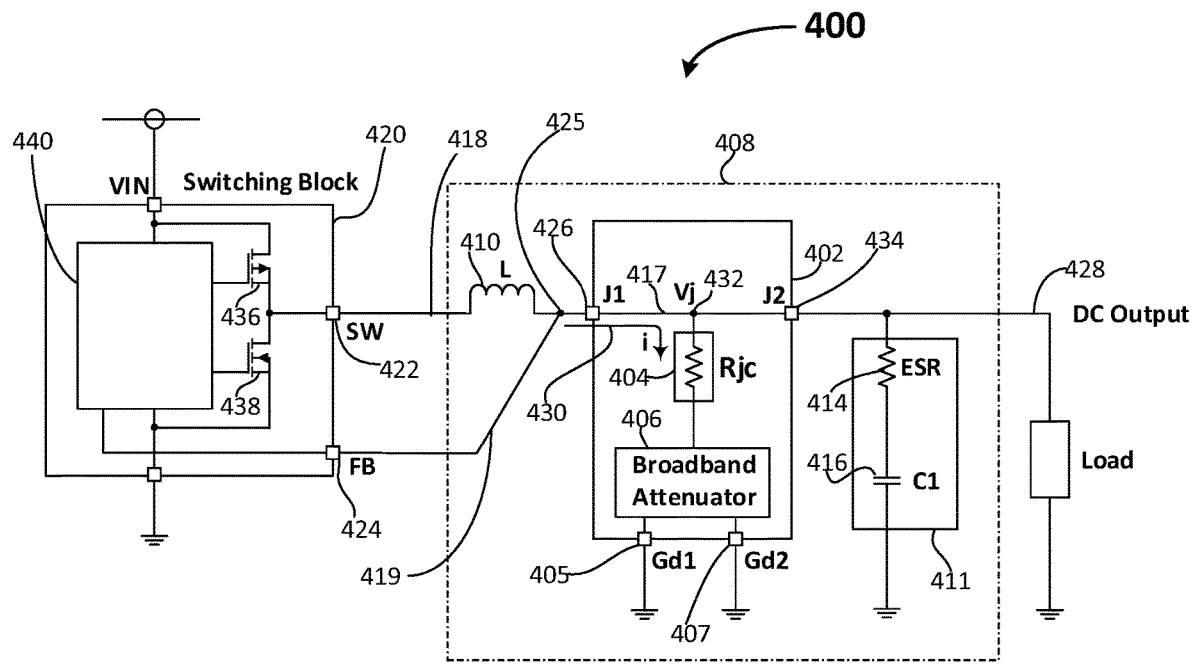
FIGS. 4A, 4B, 4C and 4D are schematic diagrams of a feedback control loop circuitry having a transistor switching stage featuring different respective embodiments of the present invention.

These goals are achieved, in one or more embodiments of the invention by a switching mode DC-DC converter circuit topology that comprises a first switching block means and a filter arrangement. As illustrated in FIG. 4A, a switching mode DC-DC converter circuit topology 400 comprises a switching block 420 and a filter circuit arrangement 408. In one or more embodiments, the first switching block means comprises the switching block 420. The switching block 420 can comprise one or more electrical members selected from the group consisting of feedback control loop circuit, power conversion circuit, transistor switching stage, inductor, electrical terminal, conductive plane, wire, via, aperture, resistive lead, inductive lead and electrical plate. A PFM DC-DC converter control loop circuitry 440 is an example of one circuit that may be used in the switching block 420 in that the control loop 440 monitors the feedback voltage at feedback node 424 and compares the feedback voltage to a predetermined switching decision threshold in order to toggle the on and off stages of the top MOSFET driver 436 and bottom MOSFET driver 438, thereby providing a pulse train voltage waveform at the switching node 422. SNJ and AC components of the pulse train voltage waveform on the rail 417 are then modified and removed by a novel filter circuit arrangement 408 thereby providing low SNJ and low noise regulated DC voltage at the output rail 428. As illustrated in FIG. 13B, the present invention has eliminated the bulge 1300 as shown in FIG. 13A such that the SNJ measurement, expressed as SNJ density, is reduced from approximately 8.4% (with the bulge 1300 in FIG. 13A) to 4% (without the bulge 1306 in FIG. 13B) in this example, notwithstanding the fact that conventional noise power 1304 with higher amplitudes similar to noise power 1302 still exists in the measurement as a result of the switching and jittering of the output signal.

The filter arrangement comprises an inductor, a passive signal conditioning means, and a low-ESR MLCC decoupling capacitor. FIG. 4A illustrates filter circuit arrangement 408 that comprises an inductor 410, a passive signal conditioning means comprises a sub-circuit or passive signal conditioning device 402 and a low-ESR MLCC decoupling capacitor 411. In one or more embodiments, the passive signal conditioning means comprises the sub-circuit or passive signal conditioning device 402. The sub-circuit 402 is one embodiment of the passive signal conditioning means that may be used to realize one embodiment of the novel filter circuit arrangement 408. In one or more embodiments, the passive signal conditioning device 402 comprises a first substantial predetermined signal conditioning equivalent series resistance (Rjc) 404 and a broadband attenuator or capacitor 406 having at least three terminals, the broadband attenuator or capacitor characterized by frequencies at and below a specified self-resonant frequency (SRF) effective to satisfy the first substantial predetermined signal conditioning equivalent series resistance (Rjc) 404. A rail 417 connects the input terminal J1 426 and output terminal J2 434 of the passive signal conditioning device 402, and is electrically coupled to either of the terminals of Rjc 404, while the other terminal of Rjc 404 is electrically coupled to the broadband attenuator or capacitor 406 which is electrically coupled to a ground potential rail by ground terminals Gd1 405 and Gd2 407. Low-ESR MLCC decoupling capacitor 411 is represented by the equivalent circuit models of ESR 414 and capacitance Cl 416. Either of the terminals of inductor 410 is connected to the switching node 422 and the other terminal of inductor 410 is connected to the feedback node 424 at a common connection junction 425 joined by the output path 418 and feedback path 419. The rail 417 of the passive signal conditioning device 402 and either of the terminals of the low-ESR MLCC decoupling capacitor 411 are connected in sequence, according to the illustrations in FIGS. 4A, 4B, 4C and 4D, on the rail between the junction 425 and output rail 428. The other terminal of the low-ESR MLCC decoupling capacitor 411 is connected to a ground potential rail. The input terminal 426 and the rail 417 of the passive signal conditioning device 402 may be connected at a position substantially in close proximity to the junction 425.

Figure 5:
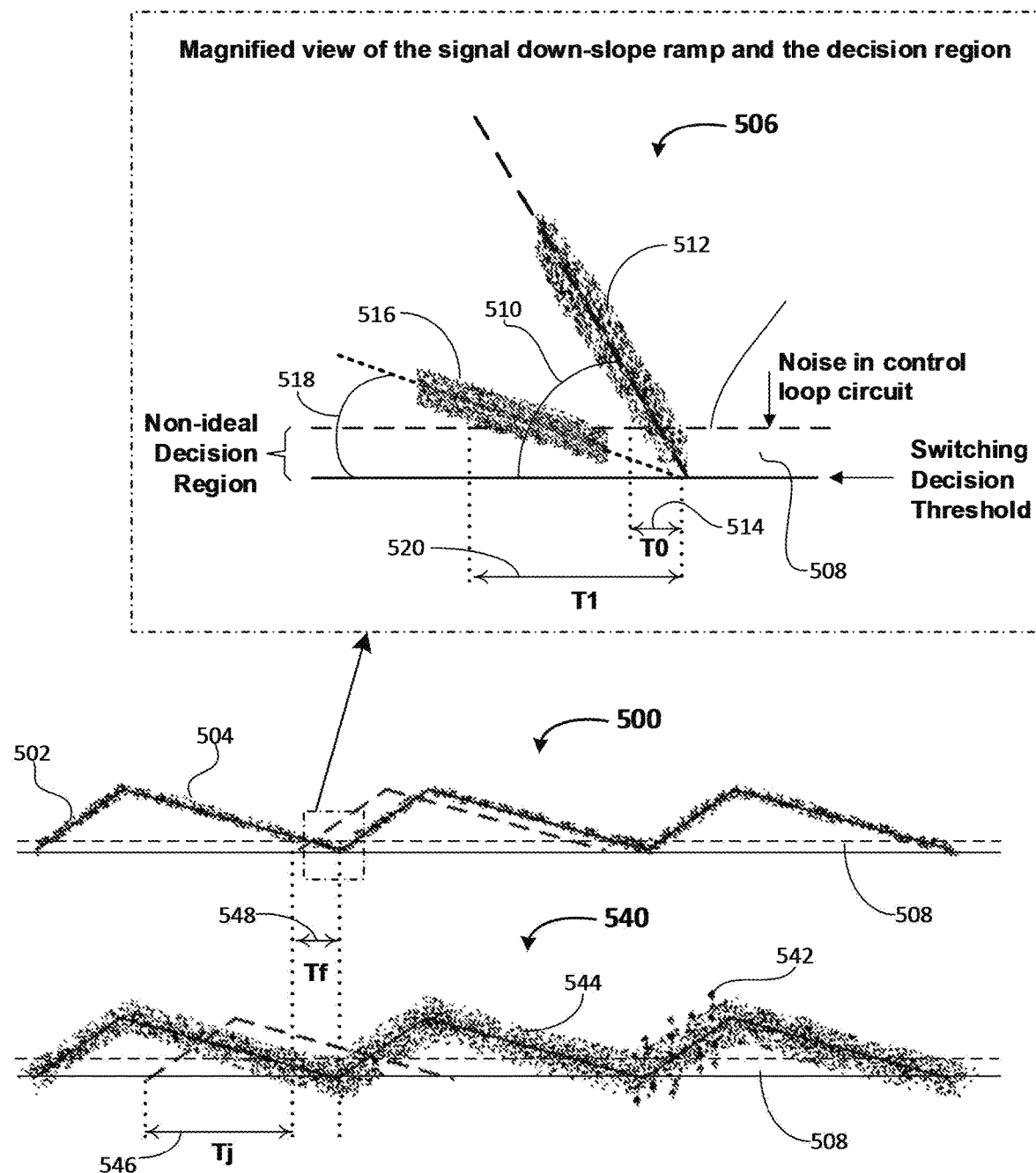
FIG. 5 is a waveform diagram illustrating the transient noise displacement or noise perturbation (denoted as Tj, Tf, T0 and T1) induced by a noisy waveform in time domain (i.e. SNJ signature) and how SNJ signature is reduced in accordance with the invention.

While the decoupling capacitor 411 reduces the amplitude of ripple voltage on the rail 417 and the output rail 428, the alternating inductor current 430 creates a voltage drop across Rjc 404 thereby producing a substantially noise suppressed feedback voltage waveform Vj 432 while the broadband attenuator or capacitor 406 provides approximately 50 dB noise suppression (i.e. decoupling) across a frequency spectrum of about 100 MHz which is extended from 1 MHz to below and from 1 MHz to above. Thus, the feedback voltage waveform Vj 432 carries substantially lowered noise when entering the non-ideal control loop circuitry at the feedback node 424. Furthermore, in order to understand why Rjc 404 and the noise suppression of the feedback voltage waveform Vj 432 are essential to modify and reduce SNJ on the rail 417 and the output rail 428, FIG. 5 provides a graphical representation which may be described with the aid of mathematical equations according to the invention.

With reference to FIGS. 5 and 4A, 4B, 4C and 4D, feedback voltage waveform Vj 432 may be represented by a low noise waveform 500 or a noisy waveform 540 when the Rjc 404 of passive signal conditioning device 402 is coupled with or without the broadband attenuator or capacitor 406 respectively. The low noise waveform 500 is comprised of substantially noise attenuated signal up-slope ramps 502 and substantially noise attenuated signal down-slope ramps 504. The noisy waveform 540 has the same voltage profile as the low noise waveform 500 except more noise is carried on the signal up-slope ramps 542 and signal down-slope ramps 544. In addition, since no control loop circuit 440 is completely free of noise, the switching threshold presents a non-ideal decision region 508 due to the noise in the control loop circuit. If the low noise waveform 500 and the noisy waveform 540 approach the same non-ideal decision region 508 respectively, the noisy waveform 540 will induce more transient noise displacement or noise perturbation in time Tj 546 of the noise than the transient noise displacement or noise perturbation in time Tf 548 of the noise induced by the low noise waveform 500. As a result, larger transient noise displacement or noise perturbation in time triggered by the noisy waveform 540 produces larger SNJ signatures on the rail 417 and output rail 428, while the decreased transient noise displacement or noise perturbation in time triggered by the low noise waveform 500 produces minimal SNJ signatures on the rail 417 and output rail 428.

Furthermore, if "L" represents the inductance of inductor 410, and "i" represents the inductor current 430, the feedback voltage Vj 432 which appears at input terminal J1 426 and junction 425 (i.e. the same feedback voltage appears at the feedback node 424) is mathematically represented by the following equation:

$$Vj = -L \times \frac{di}{dt}$$

If "Rjc" represents the substantial equivalent series resistance 404 of the passive signal conditioning device 402, multiplying the above equation by Rjc on both sides and rearranging the equation modifies the mathematical representation as follows:

$$Rjc \times \frac{di}{dt} = -\frac{Rjc}{L} \times Vj$$

If "m" represents the slopes of signal down-slope ramps 504 or 544 in FIG. 5, m is mathematically described as:

$$m = -Rjc \times \frac{di}{dt}, \text{ or}$$

$$m = \frac{Rjc}{L} \times Vj$$

As a result, the slopes of signal down-slope ramps 504 or 544 are proportional to Rjc (i.e. the equivalent series resistance Rjc 404 of the passive signal conditioning device 402). In the case where the resistance Rjc 404 of passive signal conditioning device 402 corresponding to the range of switching frequencies of switching block 420 is substantially higher (for example, more than 3 times higher) than the corresponding ESR 414 (for example, about 2 mΩ) of low-ESR MLCC decoupling capacitor 411 of filter circuit arrangement 408 with respect to the range of switching frequencies of the switching block 420, the negative slopes of feedback signal down-slope ramps 504 increase, and hence the voltage profile of feedback signal down-slope ramps 504 approaches the non-ideal decision region 508 (as illustrated in the magnified view 506 of the signal down-slope ramps and decision region) with an increased ramping angle or steepened slope 510. When feedback signals 512 and 516 consisting of the same voltage and noise profile approach the non-ideal decision region 508, signal 512 having a greater ramping angle or steeper slope 510 while signal 516 having a smaller ramping angle or less-steep slope 518 (i.e. damped slope), the transient noise displacement or noise perturbation in time T1 520 induced by signal 516 is much larger than the transient noise displacement or noise perturbation in time T0 514 induced by signal 512. As a result, a substantially larger Rjc 404 of passive signal conditioning device 402 also helps to minimize the transient noise displacement or noise perturbation in time triggered by the low noise waveform 500, and thereby the overall SNJ signatures at the rail 417 and the output rail 428 are further reduced to a minimum in conjunction with the broadband attenuator disclosed above.

Figure 4B:
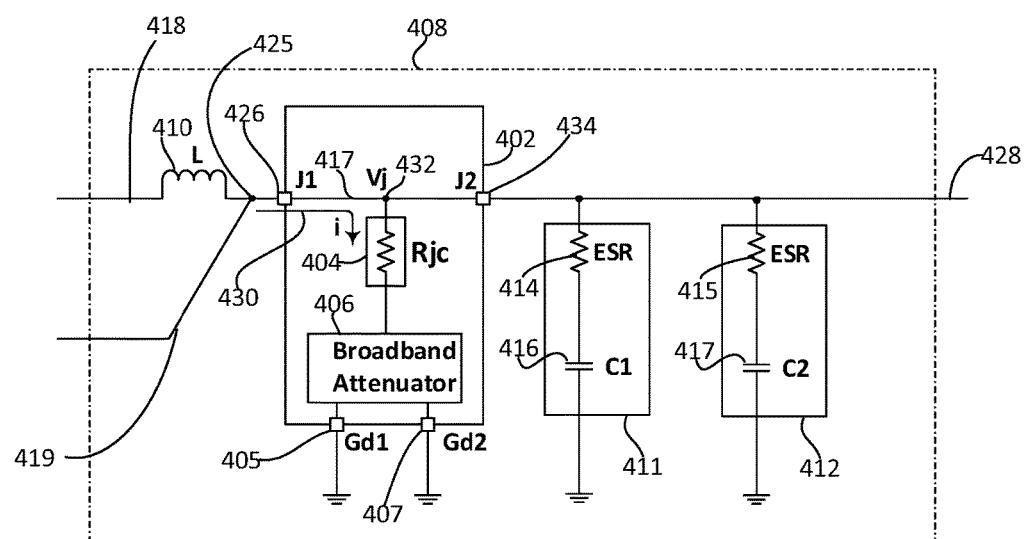

Another embodiment of the new filter circuit arrangement 408 is illustrated in FIG. 4B, in which the passive signal conditioning device 402 has the same structure as illustrated in FIG. 4A except an additional low-ESR MLCC 412 is added in parallel to the MLCC 411, thereby further reducing the ripple voltage at the rail 417 and the output rail 428 as necessary.

Figure 4C:
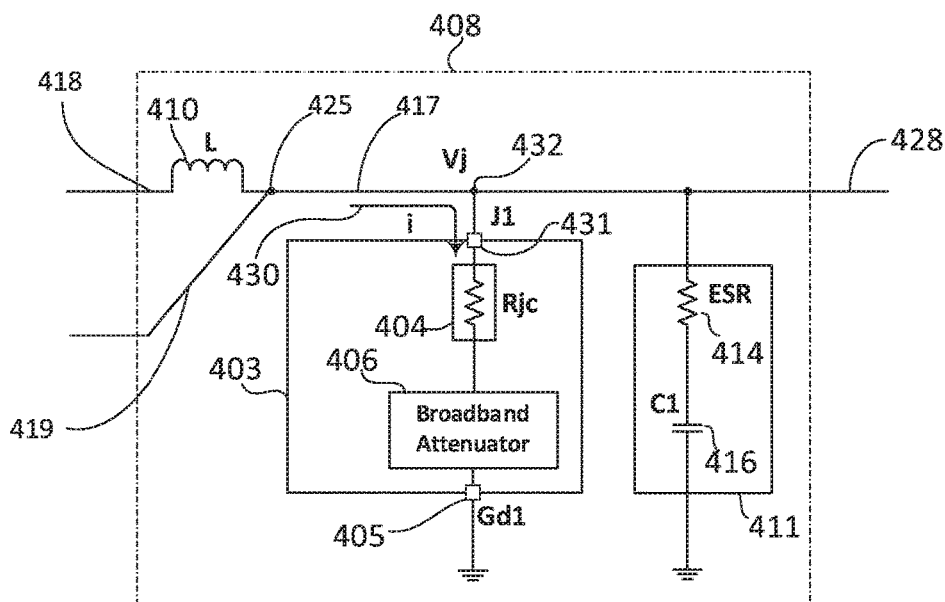
Figure 4D:
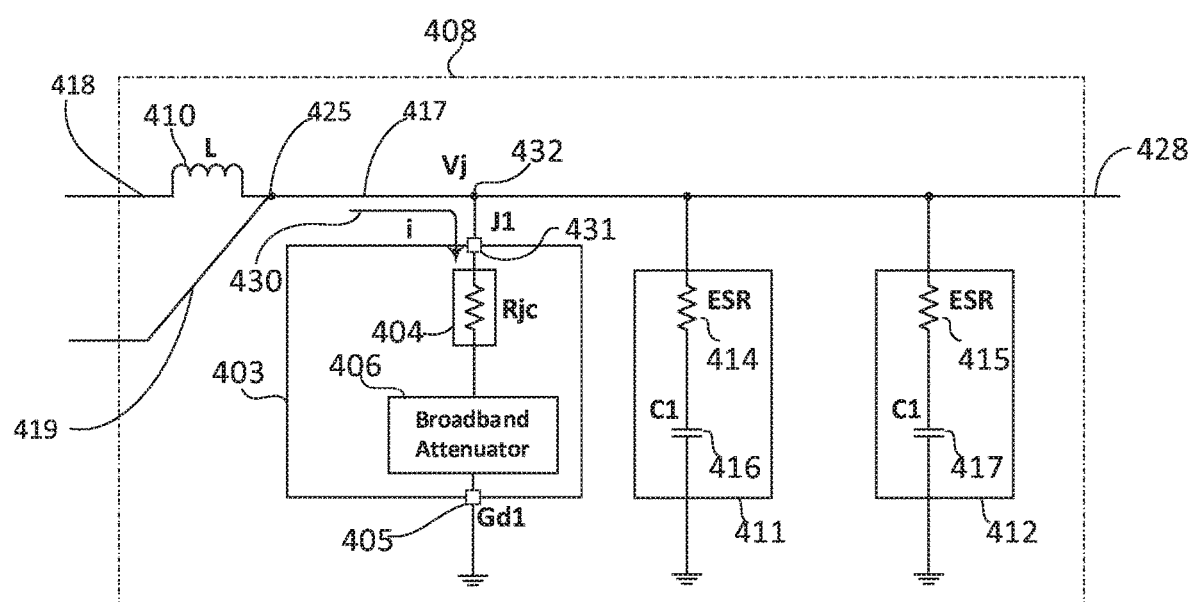

Further embodiments of the new filter circuit arrangement 408 are illustrated in FIGS. 4C and 4D, in which the electrical characteristics of the passive signal conditioning device 403, MLCC 411 and MLCC 412 are the same as illustrated in FIGS. 4A and 4B respectively, except the 4-terminal passive signal conditioning device 402 is modified to a 2-terminal passive signal conditioning device 403, in which one terminal J1 431 is connected to the rail 417 and the other ground terminal Gd1 is connected to a ground potential.

Figure 6:
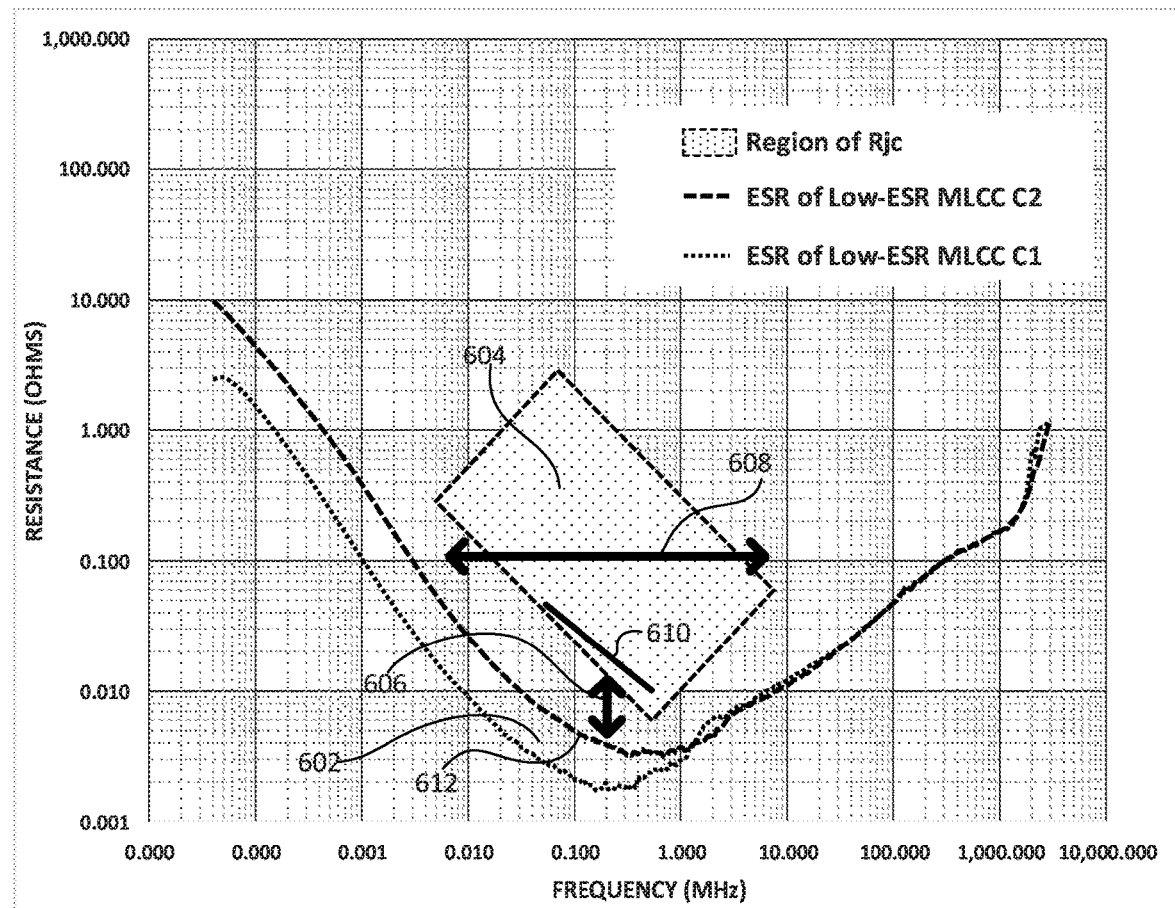
FIG. 6 is a graph illustrating equivalent series resistance values with respect to frequencies of the Rjc of FIGS. 4A, 4B, 4C and 4D.

FIG. 6 illustrates the characteristics of equivalent series resistances with respect to frequencies of the circuits described by the embodiments of FIGS. 4A, 4B, 4C and 4D. ESR profile 602 is characteristic of low-ESR MLCC decoupling capacitors 411 and 412 and is commonly used in conventional averaging filters. The region of equivalent series resistance values 604 is an illustrative example of the field of equivalent series resistance values required for Rjc 404 of passive signal conditioning device 402 or 403 with respect to a range of switching frequencies of DC-DC converters. Other fields may become apparent to one skilled in the art and are within the scope of the present invention. Another means for defining the equivalent series resistance values of Rjc 404 may be expressed in a ratio 606 of Rjc 404 to the corresponding ESR 414 or ESR 415 with respect to the range of switching frequencies of DC-DC converters. As an exemplary embodiment of the present invention, the ratio 606 may be three or higher with respect either to a predetermined range of switching frequencies 608 of DC-DC converters or to frequencies at and below the self-resonant frequency (SRF) of the low-ESR MLCC decoupling capacitors. For example, if a PFM DC-DC converter operates in a range of variable switching frequencies from about 40 kHz to 600 kHz in response to changing load conditions, ESR profile 610 of Rjc 404 with respect to the frequency range of about 40 kHz to 600 kHz may be used to form the passive signal conditioning device 402 or 403. In addition, a low-ESR MLCC C2 with ESR profile 612 may be used for the MLCC 411 or 412 to construct the filter circuit arrangement 408. In another embodiment of the present invention, the region of equivalent series resistance values 604 may be in a range of approximately 8 mΩ to 2 Ω for the Rjc 404 of passive signal conditioning device 402 or 403 with respect to a predetermined range of DC-DC converter switching frequencies which cover from approximately 10 Hz to 10 MHz.

Figure 7:
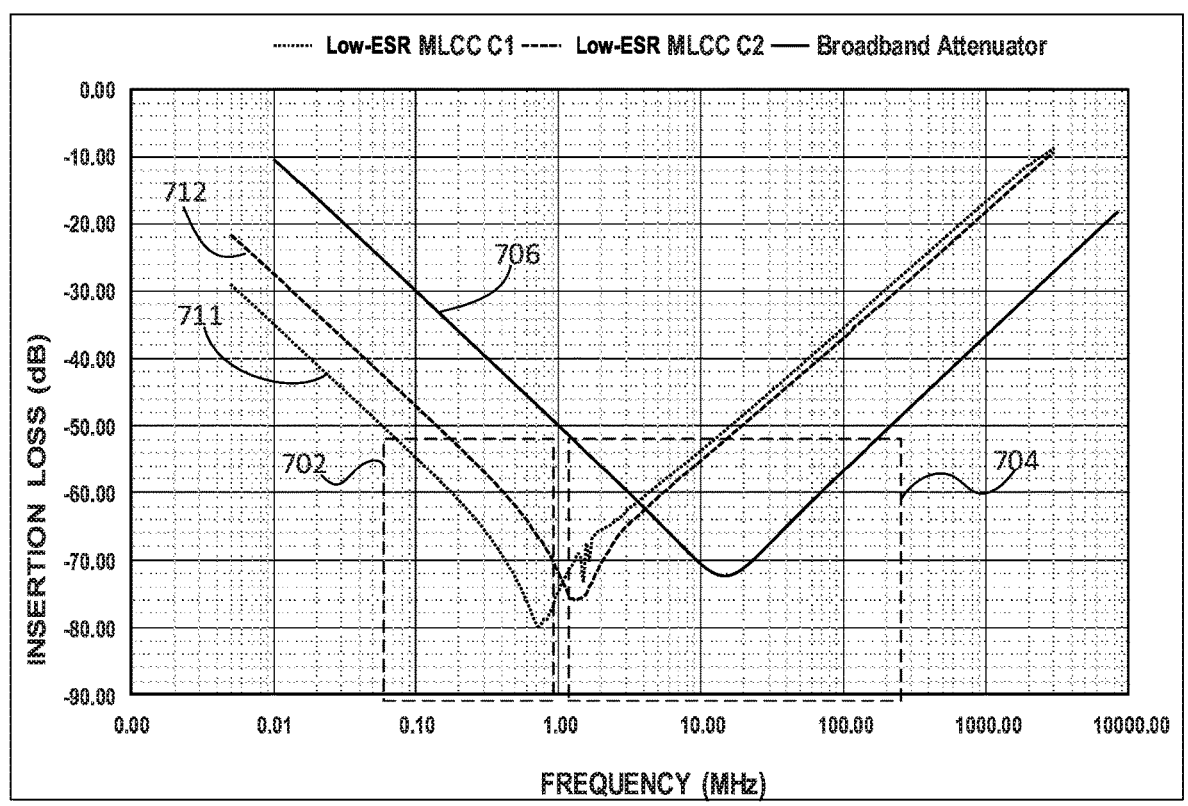
FIG. 7 is a graph illustrating the insertion loss characteristics of the broadband attenuator 406 and the filter circuit arrangement 408 in low and high frequency regions according to FIGS. 4A, 4B, 4C and 4D.

FIG. 7 illustrates the insertion loss characteristics of the broadband attenuator 406 and the filter circuit arrangement 408 of the embodiments of FIGS. 4A, 4B, 4C and 4D. In an embodiment of the present invention, the insertion loss characteristics of the broadband attenuator 406 and the filter circuit arrangement 408 may be represented collectively by the substantial attenuation in a low frequency region 702 (extended from 1 MHz to below) and a high frequency region 704 (extended from 1 MHz to above) such that the low frequency region 702 and the high frequency region 704 have a combined range of at least approximately 100 MHz for substantial noise attenuation (e.g. may be approximately 50 dB). In another embodiment of the present invention, filter circuit arrangement 408 made with a parallel combination of broadband attenuator 406 and low-ESR MLCC decoupling capacitor 411 (or capacitors 411 and 412) may provide insertion loss or attenuation of noise substantially greater (e.g. 50 dB attenuation or more), in at least the low frequency region 702, than in a case where the low-ESR MLCC decoupling capacitor 411 (or capacitors 411 and 412) is (or are) not connected, such that the combined range of the insertion loss characteristic 706 of the broadband attenuator 406 and the insertion loss characteristic 711 of the low-ESR MLCC decoupling capacitor 411 (or the characteristics 711 and 712 of capacitors 411 and 412 respectively) satisfies the attenuation in both low frequency region 702 (extended from 1 MHz to below) and the high frequency region 704 (extended from 1 MHz to over 100 MHz) which substantially exceeds 100 MHz for a predetermined switching frequency or frequencies. One example that may be used for the predetermined switching frequency is 1 MHz or below. Thus, additional attenuation in low frequency region 702 may be realized by using a low-ESR MLCC decoupling capacitor 411 or capacitors 411 and 412 represented by the insertion loss characteristic 711 or characteristics 711 and 712 respectively, providing about 50 dB attenuation or more of switching frequencies (i.e. ripple or signal up-slope ramps and signal down-slope ramps) from about 60 kHz to 1 MHz. The purpose of the low-ESR MLCC is to suppress the amplitude of output ripple voltage (i.e. signal up-slope ramps and signal down-slope ramps) with a predetermined switching frequency or frequencies on the rail 417 and output rail 428 to an appropriate level. Simultaneously, broadband attenuator 406 coupled to Rjc 404 may provide a wide attenuation bandwidth of noise present on the feedback voltage waveform Vj 432 with insertion loss characteristic 706 if the feedback voltage carries high frequency noise as illustrated by the noisy waveform 540. The combined insertion loss characteristics 706 of the broadband attenuator 406 and 711 (or 711 and 712) of the low-ESR MLCC may provide 50 dB attenuation or more of noise with respect to a range of low and high frequencies (regions 702 and 704) collectively extended from below 1 MHz to 100 MHz or higher (i.e. attenuation bandwidth of about 100 MHz or more). Thus, a clean feedback voltage waveform Vj 432 as illustrated by the low noise waveform 500 is provided to the feedback node 424.

Figure 8:
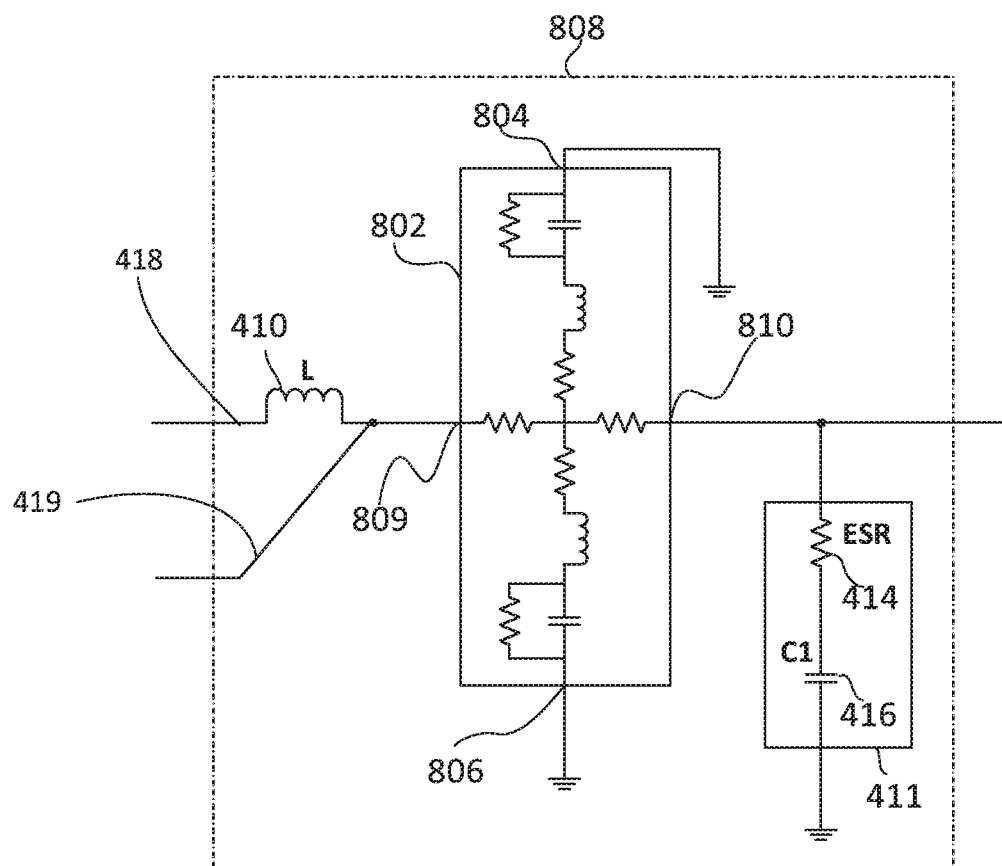
FIG. 8 is a circuit model illustrating a modification of the passive signal conditioning device 402 and 403 of FIGS. 4A, 4B, 4C and 4D.

FIG. 8 illustrates a modification of the circuit model of filter circuit arrangement 408 of the embodiments of FIGS.

4A, 4B, 4C and 4D. Circuit model of filter circuit arrangement 808 is similar to the circuit model of filter circuit arrangement 408 except the topology of the passive signal conditioning device 402 and 403 including rail 417, Rjc 404 and broadband attenuator 406 are modified to another topology represented by the equivalent circuit 802 corresponding to the rail 417, the Rjc 404 and the broadband attenuator 406 of the passive signal conditioning device 402 and 403. Terminals 809 and 810 are equivalent to terminals 426 and 434 respectively. Terminals 804 and 806 are equivalent to terminals 405 and 407 respectively.

Figure 3:
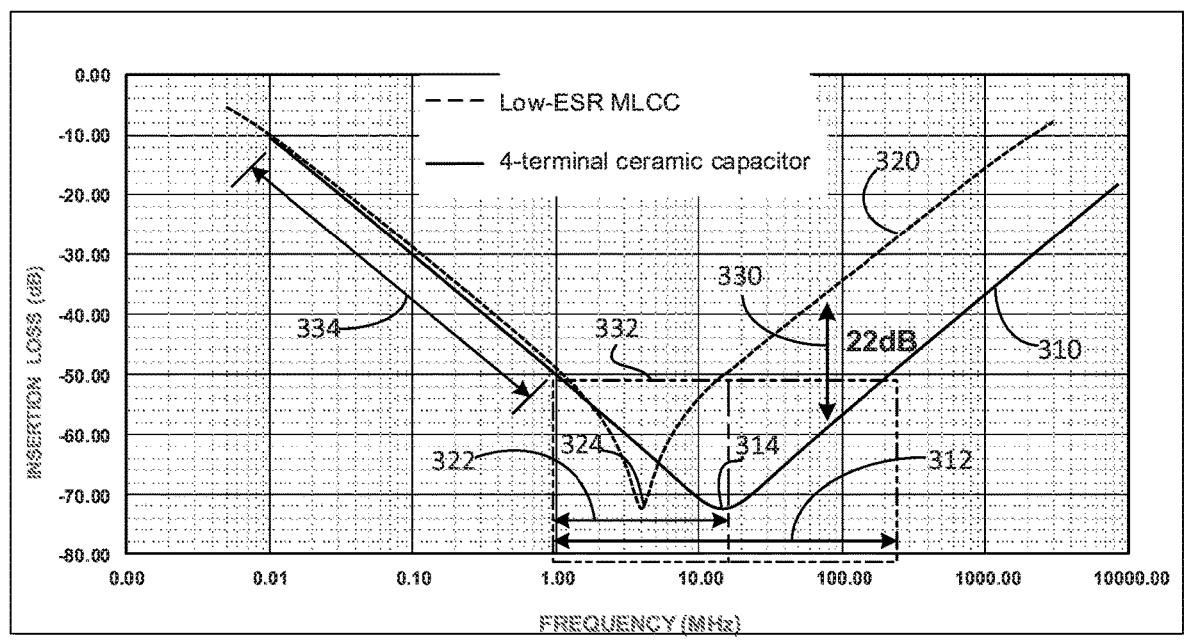
FIG. 3 is a comparison of insertion loss of a prior art 4-terminal ceramic capacitor and low-ESR MLCC.

The present disclosure reveals that, although all 4-terminal ceramic capacitors have been designed and used to provide improved decoupling of high frequency noise beyond their SRF (as illustrated in FIG. 3) through a reduction in ESR comparable to low-ESR MLCCs and low equivalent series inductance (ESL), not all 4-terminal ceramic capacitors are the same.

According to the invention, characterization of various 4-terminal ceramic capacitors has shown that X2Y attenuators exhibit substantially higher ESR compared to other 4-terminal ceramic capacitors as frequency decreases below the SRF of the X2Y. Driven by the requirement for low ESL necessary for superior high frequency attenuation performance, electrodes inside the X2Y attenuators are specially arranged. However, up to now the high ESR of the X2Y attenuators below the SRF has not been obvious and recognized due to the intended exclusive use of the X2Y for broadband noise attenuation.

With the new discovery of high ESR resistance characteristics at frequencies below the SRF of the X2Y attenuators, the present invention also reveals a new use of X2Y attenuators for increasing the slope (as illustrated in FIG. 5) of a feedback voltage ramp in a control circuit corresponding to a range of switching frequencies being at and below the SRF of the X2Y attenuators, in particularly those with negative feedback control loop and switching mode DC-DC converters according to the present invention.

Figure 9:
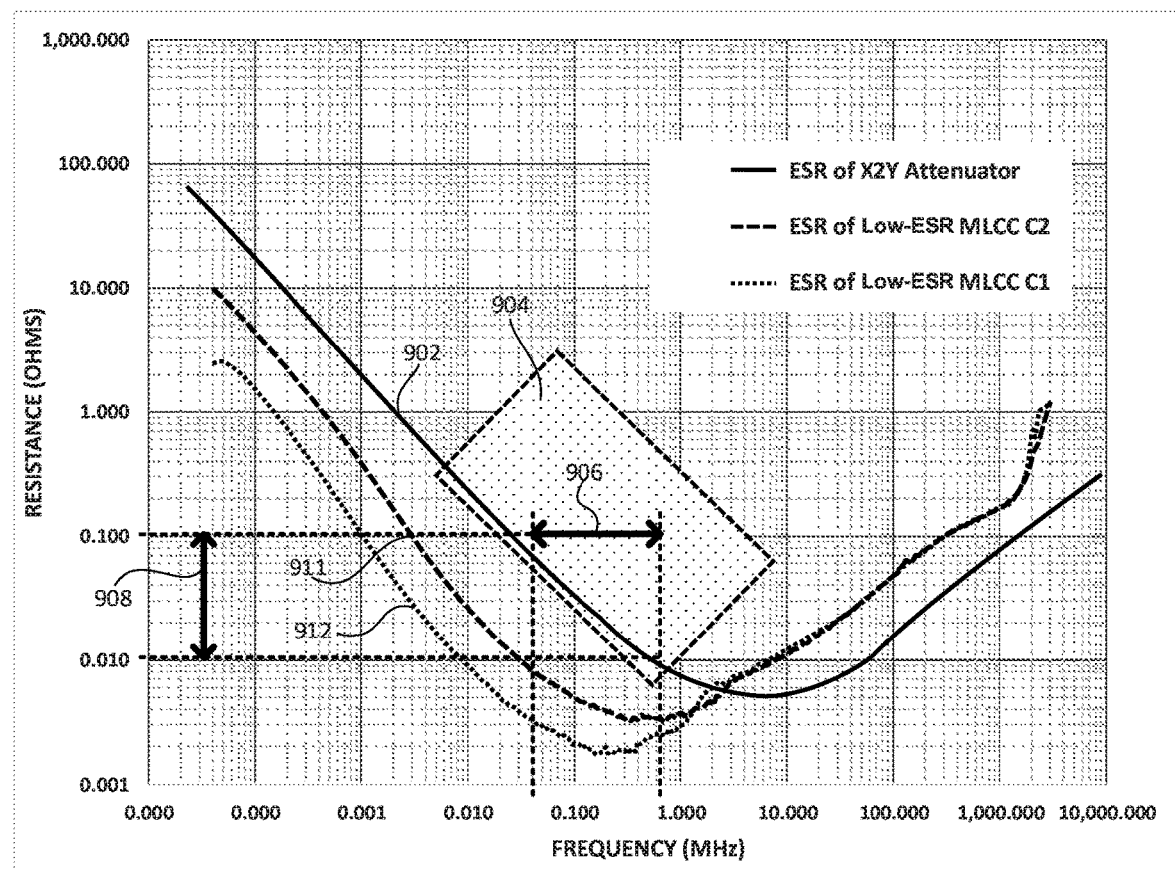
FIG. 9 is a graph showing the equivalent series resistance with respect to frequency of the modification of the circuit model of FIG. 8.

FIG. 9 illustrates the ESR characteristics of the modified equivalent circuit of passive signal conditioning device 402 and 403 of the embodiments of FIGS. 4A, 4B, 4C and 4D. Curve 902 illustrates the ESR of an X2Y attenuator. It is shown that at frequencies at 1 MHz and below, the ESR of an X2Y attenuator represented by curve 902 is significantly higher than the corresponding ESR of low-ESR MLCCs represented by curves 911 and 912 at frequencies at 1 MHz and below. Furthermore, when the region of resistance values 604 as illustrated in FIG. 6 is overlaid on FIG. 9 as exhibit 904, it becomes evident that the disadvantage at low frequency of the high ESR of an X2Y attenuator may be used to increase the slope (as illustrated in FIG. 5) of a feedback voltage ramp in a control circuit corresponding to a range of switching frequencies being at and below the SRF of the X2Y attenuator, in particularly those with a negative feedback control loop and switching mode DC-DC converters according to the present invention. As indicated in the frequency range of 906 from about 40 kHz to 600 kHz and the resistance range of 908 from about 10 mΩ to 100 mΩ, the ESR provided by the X2Y attenuator fulfills the criteria as required by the first substantial predetermined signal conditioning equivalent series resistance (Rjc) 404 of passive signal conditioning device 402 and 403 in the embodiments of FIGS. 4A, 4B, 4C and 4D. Hence, an X2Y attenuator can be turned into a new use to construct part of the filter circuit arrangement 408 thereby providing SNJ reduction techniques as described in the present invention.

Figure 10:
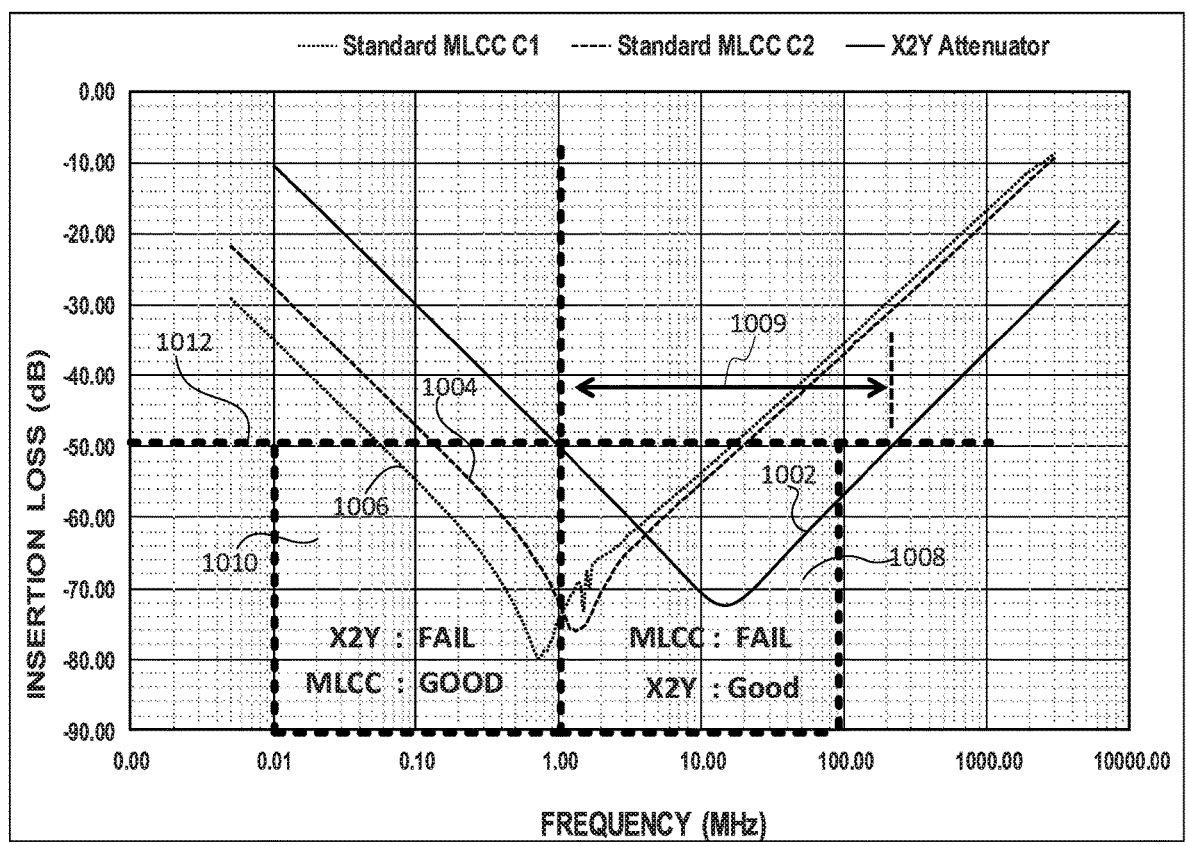
FIG. 10 is a graph showing insertion loss characteristics with respect to frequency of the modification of the circuit model of FIG. 8.

With reference to FIG. 10, curve 1002 illustrates the attenuation characteristic of an X2Y attenuator providing 50 dB 1012 or higher attenuation at a bandwidth of 200 MHz 1009. Hence it satisfies the high frequency region 1008 as set forth herein according to the present invention in which broadband attenuator 406 provides substantial attenuation (approximately 50 dB) with an attenuation bandwidth of approximately 100 MHz or higher. However, although an X2Y attenuator is suitable for high frequency attenuation as illustrated in region 1008, it fails to address low frequency ripple reduction as shown in the low frequency region 1010. Therefore, further attenuation in a range of frequencies at 1 MHz and below with respect to DC-DC converter switching block 420 may be accomplished by adding standard low-ESR MLCC decoupling capacitor C1 411 thereby providing attenuation characteristic 1006 or capacitor C2 412 providing attenuation characteristic 1004 or C1 411 and C2 412 combined as illustrated in FIGS. 4A, 4B, 4C and 4D.

Figure 11A:
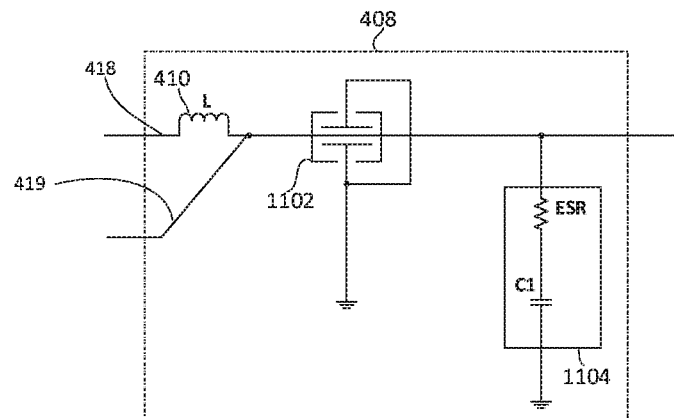
FIGS. 11A, 11B and 11C are schematic diagrams illustrating a modification of the passive signal conditioning device 402 and 403 and MLCCs of FIGS. 4A, 4B, 4C and 4D.
Figure 11B:
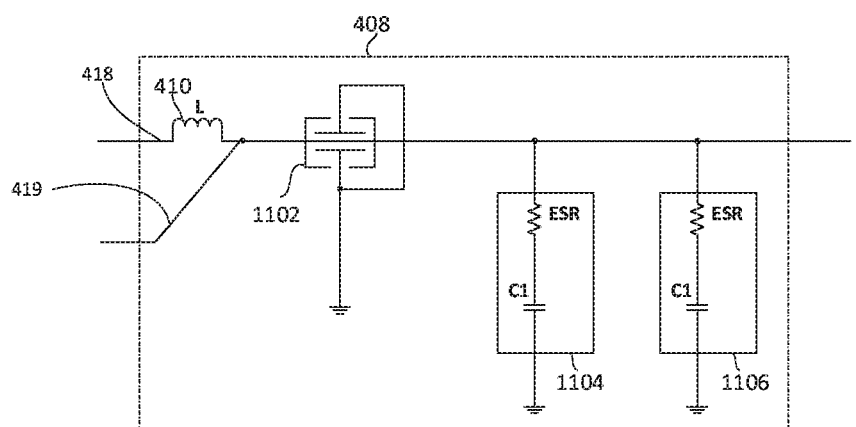
Figure 12:
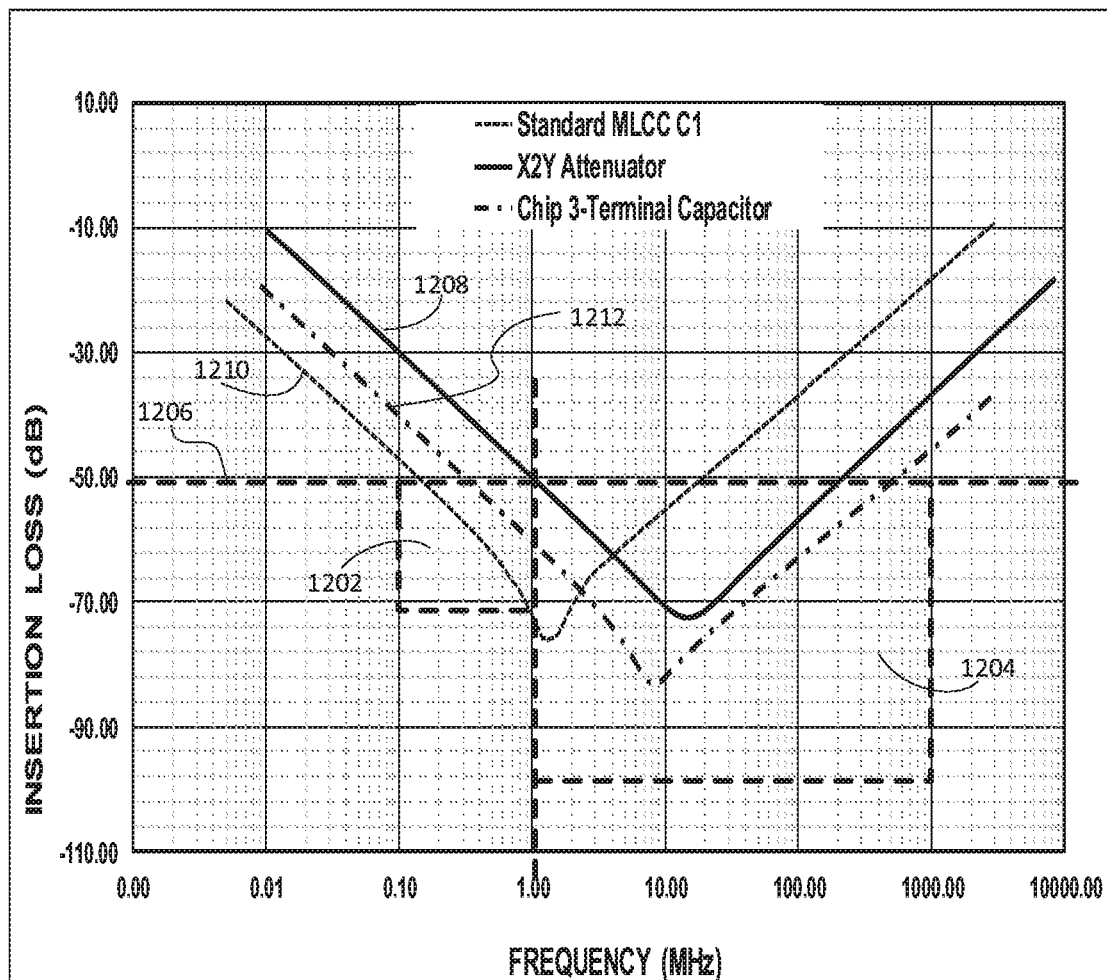
FIG. 12 is a graph showing insertion loss characteristics with respect to frequency of the circuit models of FIGS. 11A and 11C.

In a further embodiment of the present invention shown in FIGS. 11A, 11B and 12, the features of the 4-terminal passive signal conditioning device 402 of filter circuit arrangement 408 may be realized by an X2Y attenuator 1102 in a parallel combination with low-ESR MLCC decoupling capacitor 1104 or capacitors 1104 and 1106 to form filter circuit arrangement 408 according to the criteria of circuit topologies, equivalent circuits, and characteristics of ESR and insertion loss characteristics illustrated in FIGS. 4A, 4B, 4C, 4D, 5, 6, 7, 8, 9, and 10. The insertion loss characteristic of X2Y attenuator 1102 may be represented by the attenuation characteristic 1208, providing substantial attenuation in both low frequency band (extended from 1 MHz to below) and high frequency band (extended from 1 MHz to above). Further attenuation, in at least the low frequency region 1202 (extended from 1 MHz to below), may be accomplished by the low-ESR MLCC decoupling capacitor 1104 with insertion loss or attenuation characteristic 1210 so as to make insertion loss or attenuation of the filter circuit arrangement 408 substantially greater (e.g. more than 50 dB 1206) than in a case where the low-ESR MLCC decoupling capacitor 1104 is not connected and to make the combined range of the low frequency region 1202 and high frequency region 1204 substantially exceed 100 MHz. FIG. 12 illustrates that the combined range of the insertion loss or attenuation is from approximately 0.1 MHz to 1000 MHz (combining region 1202 and region 1204) with more than 50 dB attenuation 1206.

Figure 11C:
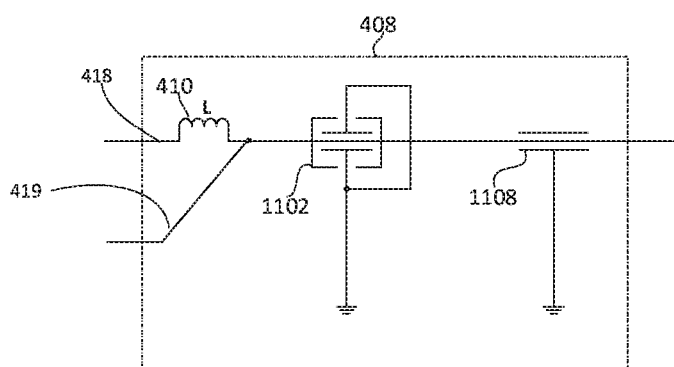

In yet a further embodiment of the present invention shown in FIGS. 11C and 12, the features of the 4-terminal passive signal conditioning device 402 of filter circuit arrangement 408 may be realized by an X2Y attenuator 1102 in a parallel combination with a generic low ESR 4-terminal ceramic capacitor 1108 (e.g. a Chip 3-Terminal capacitor) according to the criteria of circuit topologies, equivalent circuits, and characteristics of ESR and insertion loss characteristics illustrated in FIGS. 4A, 4B, 4C, 4D, 5, 6, 7, 8, 9, and 10. The insertion loss characteristic of X2Y attenuator 1102 may be represented by the insertion loss or attenuation characteristic 1208 such that it provides substantial attenuation in both low frequency band (extended from 1 MHz to below) and high frequency band (extended from 1 MHz to above). Further attenuation, in at least the low frequency region 1202, may be accomplished by the low-ESR 4-terminal ceramic capacitor 1108 with insertion loss or attenuation characteristic 1212 so as to make insertion loss or attenuation substantially greater (e.g. more than 50 dB 1206) than in a case where the low-ESR 4-terminal ceramic capacitor 1108 is not connected and to make the combined range of the low frequency region 1202 and high frequency region 1204 substantially exceed 100 MHz with more than 50 dB attenuation 1206 as shown in FIG. 12.

As a result, MLCC decoupling capacitor 1104 in FIG. 11A may be replaced by a low ESR 4-terminal ceramic capacitor 1108 in FIG. 11C with insertion loss or attenuation characteristic identified as curve 1212 in FIG. 12, thereby providing attenuation similar to standard MLCC 1104 (i.e. identified as curve 1210 in FIG. 12) in the low frequency range of region 1202 for ripple reduction. Attenuation in the high frequency region 1204 is provided collectively by the X2Y attenuator 1102 (identified as curve 1208 in FIG. 12) and the low ESR 4-terminal ceramic capacitor 1108 (identified as curve 1212 in FIG. 12) such that the high frequency region 1204 is substantially extended beyond 100 MHz reaching approximately 1000 MHz in this example.

Thus, control circuits, in particular those with negative feedback control loop and switching mode DC-DC converters, incorporating at least one of the disclosed passive signal conditioning devices 402, 403, 802, filter circuit arrangement 408, and equivalent passive signal conditioning features provided by an X2Y attenuator present unique characteristics in the time domain such that they reduce SNJ signature in output noise, which is produced by transient noise displacement in time, thereby improving supply bias noise characteristics when at least one of the disclosed passive signal conditioning devices provides the conditioned output signal to cooperate with the control circuits. In the case of PFM DC-DC converters incorporating at least one of the disclosed embodiments according to the present invention, chaotic noise is no longer presented to powered circuit elements, hence a PFM DC-DC converter using the disclosed passive signal conditioning device (402 or 403) or filter circuit arrangement 408 in the averaging filter improves performance and stability of noise-sensitive RF and microwave circuitries and systems, and time domain functions such as clock circuits, oscillators, analog-to-digital converters, integrator, convolution of signals and the like, as well as delivering improved power conversion efficiency from light load/standby to full load operation, and without compromise on overall supply bias noise and stability of the regulated voltage under the influence of pulsed load conditions due to power saving operation modes.

While exemplary embodiments of the invention have been shown and described herein, numerous variations and alternate embodiments will occur to those skilled in the art. For example, while described in connection with PFM switching mode DC-DC converters, the invention is applicable to many different types of switching mode DC-DC converters and linear regulators, as well as other applications utilizing control circuits, particularly those that include negative feedback loops. Although various component combinations have been described herein, other embodiments and component combinations will occur to those skilled in the art and may be used to realize the claimed invention without departing from the spirit and scope of the invention as defined by the appended claims.

What is claimed is:

1. A circuit arrangement for reducing a switching noise jitter signature, said circuit arrangement comprising:
   (a) a feedback control loop circuitry including a first switching block means configured for (i) defining output and feedback paths, (ii) providing access to a non-ideal noise carrying decision region of a predetermined threshold in said feedback control loop circuitry, (iii) conducting an output signal comprising a plurality of noise carrying jittering ramps with at least one type of frequency domain noise having a substantial pre-existing noise amplitude through said output and feedback paths, (iv) cycling said output signal comprising said plurality of noise carrying jittering ramps with said frequency domain noise having said substantial pre-existing noise amplitude into and out of said feedback control loop circuitry through said output and feedback paths, and (v) comparing and switching said output signal comprising said plurality of noise carrying jittering ramps with said frequency domain noise having said substantial pre-existing noise amplitude to said non-ideal noise carrying decision region and between predetermined stages at one or more use frequencies falling within a predetermined frequency range respectively;
   (b) a common connection junction joined by said output and feedback paths being disposed and electrically connected in close proximity to said feedback control loop circuitry;
   (c) one or more signal terminals connected in close proximity to said common connection junction, said signal terminals configured to receive and conduct said output signal into and out of said feedback control loop circuitry through said output and feedback paths;
   (d) one or more rails configured to contiguously connect said signal terminals such that said output signal is conducted on said rails, said rails comprising one or more conductive materials selected from the group consisting of conductive plane, electrical wire, via, aperture, resistive lead, inductive lead and electrical plate; and
   (e) a passive signal conditioning means including said rails connected in shunt to said signal terminals and characterized by a set of specified characteristics to condition (i) said substantial pre-existing noise amplitude and (ii) a plurality of slopes of said plurality of noise carrying jittering ramps of said output signal at said common connection junction and said rails such that, when the conditioned said output signal is compared to said non-ideal noise carrying decision region and switches between said predetermined stages at said one or more use frequencies falling within said predetermined frequency range, a reduction in transient noise displacement in time of said frequency domain noise results from improved interactions between the conditioned said frequency domain noise and said noise carrying decision region and is provided in said output and feedback paths, said passive signal conditioning means being electrically coupled closely and disposed in a closer proximity to said common connection junction of said output and feedback paths than in a case in which conventional frequency domain filters and capacitors are connected thereto;

whereby the switching noise jitter signature, produced by transient noise displacement in time of said frequency domain noise with said substantial pre-existing noise amplitude present on said output signal, can be reduced in said output and feedback paths when said circuit arrangement provides the improved interactions between said frequency domain noise and said noise carrying decision region, the switching noise jitter signature being detrimental to the signal integrity of the noise-sensitive applications.

2. The circuit arrangement of claim 1 wherein said set of specified characteristics of said passive signal conditioning means is configured such that said set of specified characteristics is capable of:

(a) attenuating said substantial pre-existing noise amplitude in specified low and high frequency bands of said output signal present on said common connection junction and said rails, said specified low frequency band being less than or equal to 1 MHz and said specified high frequency band being greater than 1 MHz, such that a combined range of said specified low frequency band and said specified high frequency band is at least 100 MHz to result in an attenuated noise amplitude in said output signal, and (b) steepening said plurality of slopes of said plurality of noise carrying jittering ramps with the attenuated noise amplitude of said output signal corresponding to said one or more use frequencies falling within said predetermined frequency range.

3. The circuit arrangement of claim 2 wherein said set of specified characteristics comprises a first substantial predetermined signal conditioning equivalent series resistance (ESR) corresponding to said one or more use frequencies falling within said predetermined frequency range so as to cause said plurality of slopes of said plurality of noise carrying jittering ramps with the attenuated noise amplitude of said output signal to be steepened at said common connection junction and said rails corresponding to said one or more use frequencies falling within said predetermined frequency range, said first substantial predetermined signal conditioning ESR falling within a predetermined range in ohms being greater than corresponding ESRs typical of conventional multilayer ceramic capacitors corresponding to said one or more use frequencies falling within said predetermined frequency range.

4. The circuit arrangement of claim 3 wherein said first substantial predetermined signal conditioning ESR falling within said predetermined range in ohms, corresponding to said one or more use frequencies falling within said predetermined frequency range, is between approximately 8 milliohms and 2 ohms.

5. The circuit arrangement of claim 3 wherein said first substantial predetermined signal conditioning ESR falling within said predetermined range in ohms, corresponding to said one or more use frequencies falling within said predetermined frequency range from approximately 10 Hz to 10 MHz, is between approximately 8 milliohms and 2 ohms.

6. The circuit arrangement of claim 3 wherein said first substantial predetermined signal conditioning ESR falling within said predetermined range in ohms, corresponding to said one or more use frequencies falling within said predetermined frequency range of approximately 1 MHz and below, is between approximately 8 milliohms and 2 ohms.

7. The circuit arrangement of claim 3, further comprising:
at least one frequency domain filter part disposed farther than said passive signal conditioning means from said common connection junction of said output and feedback paths and said rails, connected in parallel alongside said passive signal conditioning means, and characterized by (i) a predetermined filter self-resonant frequency (SRF), (ii) a corresponding predetermined filter ESR corresponding to said one or more use frequencies at and below said predetermined filter SRF such that a ratio of said first substantial predetermined signal conditioning ESR to said corresponding predetermined filter ESR is greater than 1, and (iii) further attenuation, in at least said specified low frequency band of said frequency domain noise, greater than in a case in which said frequency domain filter part is not connected, so as to make attenuation of said frequency domain noise, in said combined range of said specified low frequency band and said specified high frequency band, greater than in a case in which said frequency domain filter part is not connected and to make said combined range of said specified low frequency band and said specified high frequency band greater than 100 MHz.

8. The circuit arrangement of claim 7 wherein said frequency domain filter part comprises at least three terminals.

9. The circuit arrangement of claim 3, wherein said passive signal conditioning means comprises a passive signal conditioning device that includes a capacitor having at least three terminals, the capacitor characterized by frequencies at and below a specified self-resonant frequency (SRF) and configured with a corresponding equivalent series resistance (ESR) effective to satisfy said first substantial predetermined signal conditioning equivalent series resistance (ESR).

10. The circuit arrangement of claim 1 wherein said feedback control loop circuitry including said first switching block means comprises one or more electrical members selected from the group consisting of feedback control loop circuit, power conversion circuit, transistor switching stage, inductor, electrical terminal, conductive plane, wire, via, aperture, resistive lead, inductive lead and electrical plate.

11. The circuit arrangement of claim 1 wherein said output signal is DC.

12. The circuit arrangement of claim 1 wherein said feedback control loop circuitry including said first switching block means is a switch mode power supply.

13. A method of reducing a switching noise jitter signature in an output of a circuit arrangement, said method comprising:

(a) providing a feedback control loop circuitry including a first switching block means configured for (i) defining output and feedback paths, (ii) providing access to a non-ideal noise carrying decision region of a predetermined threshold in said feedback control loop circuitry, (iii) conducting an output signal comprising a plurality of noise carrying jittering ramps with at least one type of frequency domain noise having a substantial pre-existing noise amplitude through said output and feedback paths, (iv) cycling said output signal comprising said plurality of noise carrying jittering ramps with said frequency domain noise having said substantial pre-existing noise amplitude into and out of said feedback control loop circuitry through said output and feedback paths, and (v) comparing and switching said output signal comprising said plurality of noise carrying jittering ramps with said frequency domain noise having said substantial pre-existing noise amplitude to said non-ideal noise carrying decision region and between predetermined stages at one or more use frequencies falling within a predetermined frequency range respectively;

(b) providing a common connection junction joined by said output and feedback paths being disposed and electrically connected in close proximity to said feedback control loop circuitry;

(c) providing one or more signal terminals connected in close proximity to said common connection junction, said signal terminals configured to receive and conduct said output signal into and out of said feedback control loop circuitry through said output and feedback paths;

(d) providing one or more rails configured to contiguously connect said signal terminals such that said output signal is conducted on said rails, said rails comprising one or more conductive materials selected from the group consisting of conductive plane, electrical wire, via, aperture, resistive lead, inductive lead and electrical plate; and (e) providing a passive signal conditioning means including said rails connected in shunt to said signal terminals and characterized by a set of specified characteristics to condition (i) said substantial pre-existing noise amplitude and (ii) a plurality of slopes of said plurality of noise carrying jittering ramps of said output signal at said common connection junction and said rails such that, when the conditioned said output signal is compared to said non-ideal noise carrying decision region and switches between said predetermined stages at said one or more use frequencies falling within said predetermined frequency range, a reduction in transient noise displacement in time of said frequency domain noise results from improved interactions between the conditioned said frequency domain noise and said noise carrying decision region and is provided in said output and feedback paths, said passive signal conditioning means being electrically coupled closely and disposed in a closer proximity to said common connection junction of said output and feedback paths than in a case in which conventional frequency domain filters and capacitors are connected thereto;

whereby the switching noise jitter signature, produced by transient noise displacement in time of said frequency domain noise with said substantial pre-existing noise amplitude present on said output signal, can be reduced in said output and feedback paths when said circuit arrangement provides the improved interactions between said frequency domain noise and said noise carrying decision region, the switching noise jitter signature being detrimental to the signal integrity of the noise-sensitive applications.

14. The method of claim 13 wherein said set of specified characteristics of said passive signal conditioning means is configured such that said set of specified characteristics is capable of:

(a) attenuating said substantial pre-existing noise amplitude in specified low and high frequency bands of said output signal present on said common connection junction and said rails, said specified low frequency band being less than or equal to 1 MHz and said specified high frequency band being greater than 1 MHz, such that a combined range of said specified low frequency band and said specified high frequency band is at least 100 MHz to result in an attenuated noise amplitude in said output signal, and (b) steepening said plurality of slopes of said plurality of noise carrying jittering ramps with the attenuated noise amplitude of said output signal corresponding to said one or more use frequencies falling within said predetermined frequency range.

15. The method of claim 14 wherein said set of specified characteristics comprises a first substantial predetermined signal conditioning equivalent series resistance (ESR) corresponding to said one or more use frequencies falling within said predetermined frequency range so as to cause said plurality of slopes of said plurality of noise carrying jittering ramps with the attenuated noise amplitude of said output signal to be steepened at said common connection junction and said rails, corresponding to said one or more use frequencies falling within said predetermined frequency range, said first substantial predetermined signal conditioning ESR falling within a predetermined range in ohms being greater than corresponding ESRs typical of conventional multilayer ceramic capacitors corresponding to said one or more use frequencies falling within said predetermined frequency range.

16. The method of claim 15 wherein said passive signal conditioning means comprises a passive signal conditioning device that includes a capacitor having at least three terminals, the capacitor characterized by frequencies at and below a specified self-resonant frequency (SRF) such that a corresponding ESR of said capacitor having at least three terminals satisfies said first substantial predetermined signal conditioning ESR.

17. The method of claim 15 wherein said first substantial predetermined signal conditioning ESR falling within said predetermined range in ohms, correspondingly to said one or more use frequencies falling within said predetermined frequency range, is between approximately 8 milliohms and 2 ohms.

18. The method of claim 17 wherein said passive signal conditioning means comprises a passive signal conditioning device that includes a capacitor having at least three terminals, the capacitor characterized by frequencies at and below a specified self-resonant frequency (SRF) such that a corresponding ESR of said capacitor having at least three terminals satisfies said first substantial predetermined signal conditioning ESR.

19. The method of claim 15 wherein said first substantial predetermined signal conditioning ESR falling within said predetermined range in ohms, corresponding to said one or more use frequencies falling within said predetermined frequency range from approximately 10 Hz to 10 MHz, is between approximately 8 milliohms and 2 ohms.

20. The method of claim 19 wherein said passive signal conditioning means comprises a passive signal conditioning device that includes a capacitor having at least three terminals, the capacitor characterized by frequencies at and below a specified self-resonant frequency (SRF) such that a corresponding ESR of said capacitor having at least three terminals satisfies said first substantial predetermined signal conditioning ESR.

21. The method of claim 15 wherein said first substantial predetermined signal conditioning ESR falling within said predetermined range in ohms, corresponding to said one or more use frequencies falling within said predetermined frequency range of approximately 1 MHz and below, is between approximately 8 milliohms and 2 ohms.

22. The method of claim 21 wherein said passive signal conditioning means comprises a passive signal conditioning device that includes a capacitor having at least three terminals, the capacitor characterized by frequencies at and below a specified self-resonant frequency (SRF) such that a corresponding ESR of said capacitor having at least three terminals satisfies said first substantial predetermined signal conditioning ESR.

23. The method of claim 15, further comprising:
providing at least one frequency domain filter part disposed farther than said passive signal conditioning means from said rails, connected in parallel alongside said passive signal conditioning means, and characterized by (i) a predetermined filter self-resonant frequency (SRF), (ii) a corresponding predetermined filter ESR corresponding to said one or more use frequencies at and below said predetermined filter SRF such that a ratio of said first substantial predetermined signal conditioning ESR to said corresponding predetermined filter ESR is greater than 1, and (iii) further attenuation, in at least said specified low frequency band of said frequency domain noise, greater than in a case in which said frequency domain filter part is not connected, so as to make attenuation of said frequency domain noise, in said combined range of said specified low frequency band and said specified high frequency band, greater than in a case in which said frequency domain filter part is not connected and to make said combined range of said specified low frequency band and said specified high frequency band greater than 100 MHz.

24. The method of claim 23 wherein said frequency domain filter part comprises at least three terminals.

25. The method of claim 23 wherein said passive signal conditioning means comprises a passive signal conditioning device that includes a selected filter or capacitor having at least three terminals, the capacitor characterized by frequencies at and below a specified self-resonant frequency (SRF) such that a corresponding ESR of said capacitor having at least three terminals satisfies said first substantial predetermined signal conditioning ESR and said ratio.

26. The method of claim 25 wherein said frequency domain filter part comprises at least three terminals.

27. The method of claim 13 wherein said feedback control loop circuitry including said first switching block means comprises one or more electrical members selected from the group consisting of feedback control loop circuit, power conversion circuit, transistor switching stage, inductor, electrical terminal, conductive plane, wire, via, aperture, resistive lead, inductive lead and electrical plate.

28. The method of claim 13 wherein said output signal is DC.

29. The method of claim 13 wherein said feedback control loop circuitry including said first switching block means is a switch mode power supply.

30. A circuit arrangement for reducing a switching noise jitter signature, said circuit arrangement comprising:
(a) a feedback control loop circuitry including a first switching block means configured for (i) defining output and feedback paths, (ii) providing access to a non-ideal noise carrying decision region of a predetermined threshold in said feedback control loop circuitry, (iii) conducting an output signal comprising a plurality of noise carrying jittering ramps with at least one type of frequency domain noise having a substantial pre-existing noise amplitude through said output and feedback paths, (iv) cycling said output signal comprising said plurality of noise carrying jittering ramps with said frequency domain noise having said substantial pre-existing noise amplitude into and out of said feedback control loop circuitry through said output and feedback paths, and (v) comparing and switching said output signal comprising said plurality of noise carrying jittering ramps with said frequency domain noise having said substantial pre-existing noise amplitude to said non-ideal noise carrying decision region and between predetermined stages at one or more use frequencies falling within a predetermined frequency range respectively;
(b) a common connection junction joined by said output and feedback paths being disposed and electrically connected in close proximity to said feedback control loop circuitry;
(c) one or more signal terminals connected in close proximity to said common connection junction, said signal terminals configured to receive and conduct said output signal into and out of said feedback control loop circuitry through said output and feedback paths;
(d) one or more rails configured to contiguously connect said signal terminals such that said output signal is conducted on said rails, said rails comprising one or more conductive materials selected from the group consisting of conductive plane, electrical wire, via, aperture, resistive lead, inductive lead and electrical plate; and
(e) a passive signal conditioning means including said rails connected in shunt to said signal terminals and configured for conditioning (i) said substantial pre-existing noise amplitude and (ii) a plurality of slopes of said plurality of noise carrying jittering ramps of said output signal at said signal terminals and said rails through a set of specified characteristics of said passive signal conditioning means capable of:
(1) attenuating said substantial pre-existing noise amplitude in specified low and high frequency bands of said output signal present on said signal terminals and said rails, said specified low frequency band being less than or equal to 1 MHz and said specified high frequency band being greater than 1 MHz, such that a combined range of said specified low frequency band and said specified high frequency band is at least 100 MHz to result in an attenuated noise amplitude in said output signal, and
(2) providing a first substantial predetermined signal conditioning equivalent series resistance (ESR) corresponding to said one or more use frequencies falling within said predetermined frequency range, said first substantial predetermined signal conditioning ESR falling within a predetermined range in ohms being greater than corresponding ESRs typical of conventional multilayer ceramic capacitors corresponding to said one or more use frequencies falling within said predetermined frequency range, such that said output signal is caused to have said plurality of noise carrying jittering ramps with steepened slopes and the attenuated noise amplitude such that when the conditioned said output signal is compared to said non-ideal noise carrying decision region and switches between said predetermined stages at said one or more use frequencies falling within said predetermined frequency range, a reduction in transient noise displacement in time of said frequency domain noise results from improved interactions between the conditioned said frequency domain noise and said noise carrying decision region and is provided in said output and feedback paths,
said passive signal conditioning means being electrically coupled closely and disposed in a closer proximity to said common connection junction of said output and feedback paths and said rails than in a case in which conventional frequency domain filters and capacitors are connected thereto; whereby the switching noise jitter signature, produced by transient noise displacement in time of said frequency domain noise with said substantial pre-existing noise amplitude present on said output signal, can be reduced in said output and feedback paths when said circuit arrangement provides the improved interactions between said frequency domain noise and said noise carrying decision region, the switching noise jitter signature being detrimental to the signal integrity of the noise-sensitive applications.

31. The circuit arrangement of claim 30 wherein said feedback control loop circuitry including said first switching block means comprises one or more electrical members selected from the group consisting of feedback control loop circuit, power conversion circuit, transistor switching stage, inductor, electrical terminal, conductive plane, wire, via, aperture, resistive lead, inductive lead and electrical plate.

32. The circuit arrangement of claim 30 wherein said first substantial predetermined signal conditioning ESR falling within said predetermined range in ohms, corresponding to said one or more use frequencies falling within said predetermined frequency range, is between approximately 8 milliohms and 2 ohms.

33. The circuit arrangement of claim 30 wherein said first substantial predetermined signal conditioning ESR falling within said predetermined range in ohms, corresponding to said one or more use frequencies falling within said predetermined frequency range from approximately 10 Hz to 10 MHz, is between approximately 8 milliohms and 2 ohms.

34. The circuit arrangement of claim 30 wherein said first substantial predetermined signal conditioning ESR falling within said predetermined range in ohms, corresponding to said one or more use frequencies falling within said predetermined frequency range of approximately 1 MHz and below, is between approximately 8 milliohms and 2 ohms.

35. The circuit arrangement of claim 30, further comprising:
at least one frequency domain filter part disposed farther than said passive signal conditioning means from said common connection junction of said output and feedback paths and said rails, connected in parallel alongside said passive signal conditioning means, and characterized by (i) a predetermined filter self-resonant frequency (SRF), (ii) a corresponding predetermined filter ESR corresponding to said one or more use frequencies at and below said predetermined filter SRF such that a ratio of said first substantial predetermined signal conditioning ESR to said corresponding predetermined filter ESR is greater than 1, and (iii) further attenuation, in at least said specified low frequency band of said frequency domain noise, greater than in a case in which said frequency domain filter part is not connected, so as to make attenuation of said frequency domain noise, in said combined range of said specified low frequency band and said specified high frequency band, greater than in a case in which said frequency domain filter part is not connected and to make said combined range of said specified low frequency band and said specified high frequency band greater than 100 MHz.

36. The circuit arrangement of claim 35 wherein said frequency domain filter part comprises at least three terminals.

37. The circuit arrangement of claim 30 wherein said output signal is DC.

38. The circuit arrangement of claim 30 wherein said feedback control loop circuitry including said first switching block means is a switch mode power supply.

39. A method of reducing a switching noise jitter signature in an output of a circuit arrangement, said method comprising:
(a) providing a feedback control loop circuitry including a first switching block means configured for (i) defining output and feedback paths, (ii) providing access to a non-ideal noise carrying decision region of a predetermined threshold in said feedback control loop circuitry, (iii) conducting an output signal comprising a plurality of noise carrying jittering ramps with at least one type of frequency domain noise having a substantial pre-existing noise amplitude through said output and feedback paths, (iv) cycling said output signal comprising said plurality of noise carrying jittering ramps with said frequency domain noise having said substantial pre-existing noise amplitude into and out of said feedback control loop circuitry through said output and feedback paths, and (v) comparing and switching said output signal comprising said plurality of noise carrying jittering ramps with said frequency domain noise having said substantial pre-existing noise amplitude to said non-ideal noise carrying decision region and between predetermined stages at one or more use frequencies falling within a predetermined frequency range respectively;

(b) providing a common connection junction joined by said output and feedback paths being disposed and electrically connected in close proximity to said feedback control loop circuitry;

(c) providing one or more signal terminals connected in close proximity to said common connection junction, said signal terminals configured to receive and conduct said output signal into and out of said feedback control loop circuitry through said output and feedback paths;

(d) providing one or more rails configured to contiguously connect said signal terminals such that said output signal is conducted on said rails, said rails comprising one or more conductive materials selected from the group consisting of conductive plane, electrical wire, via, aperture, resistive lead, inductive lead and electrical plate; and (e) providing a passive signal conditioning means including said rails connected in shunt to said signal terminals and configured for conditioning (i) said substantial pre-existing noise amplitude and (ii) a plurality of slopes of said plurality of noise carrying jittering ramps of said output signal at said signal terminals and said rails through a set of specified characteristics of said passive signal conditioning means capable of:
(1) attenuating said substantial pre-existing noise amplitude in specified low and high frequency bands of said output signal present on said signal terminals and said rails, said specified low frequency band being less than or equal to 1 MHz to below and said specified high frequency band being greater than 1 MHz, such that a combined range of said specified low frequency band and said specified high frequency band is at least 100 MHz to result in an attenuated noise amplitude in said output signal, and
(2) providing a first substantial predetermined signal conditioning equivalent series resistance (ESR) corresponding to said one or more use frequencies falling within said predetermined frequency range, said first substantial predetermined signal conditioning ESR falling within a predetermined range in ohms being greater than corresponding ESRs typical of conventional multilayer ceramic capacitors corresponding to said one or more use frequencies falling within said predetermined frequency range, such that said output signal is caused to have said plurality of noise carrying jittering ramps with steepened slopes and the attenuated noise amplitude such that when the conditioned said output signal is compared to said non-ideal noise carrying decision region and switches between said predetermined stages at said one or more use frequencies falling within said predetermined frequency range, a reduction in transient noise displacement in time of said frequency domain noise results from improved interactions between the conditioned said frequency domain noise and said noise carrying decision region and is provided in said output and feedback paths, said passive signal conditioning means being electrically coupled closely and disposed in a closer proximity to said common connection junction of said output and feedback paths and said rails than in a case in which conventional frequency domain filters and capacitors are connected thereto; whereby the switching noise jitter signature, produced by transient noise displacement in time of said frequency domain noise with said substantial pre-existing noise amplitude present on said output signal, can be reduced in said output and feedback paths when said circuit arrangement provides the improved interactions between said frequency domain noise and said noise carrying decision region, the switching noise jitter signature being detrimental to the signal integrity of the noise-sensitive applications.

40. The method of claim 39 wherein said feedback control loop circuitry including said first switching block means comprises one or more electrical members selected from the group consisting of feedback control loop circuit, power conversion circuit, transistor switching stage, inductor, electrical terminal, conductive plane, wire, via, aperture, resistive lead, inductive lead and electrical plate.

41. The method of claim 39 wherein said passive signal conditioning means comprises a passive signal conditioning device that includes a capacitor having at least three terminals, the capacitor characterized by frequencies at and below a specified self-resonant frequency (SRF) such that a corresponding ESR of said capacitor having at least three terminals satisfies said first substantial predetermined signal conditioning ESR and said ratio.

42. The method of claim 39 wherein said first substantial predetermined signal conditioning ESR falling within said predetermined range in ohms, correspondingly to said one or more use frequencies falling within said predetermined frequency range, is between approximately 8 milliohms and 2 ohms.

43. The method of claim 42 wherein said passive signal conditioning means comprises a passive signal conditioning device that includes a capacitor having at least three terminals, the capacitor characterized by frequencies at and below a specified self-resonant frequency (SRF) such that a corresponding ESR of said capacitor having at least three terminals satisfies said first substantial predetermined signal conditioning ESR and said ratio.

44. The method of claim 39 wherein said first substantial predetermined signal conditioning ESR falling within said predetermined range in ohms, corresponding to said one or more use frequencies falling within said predetermined frequency range from approximately 10 Hz to 10 MHz, is between approximately 8 milliohms and 2 ohms.

45. The method of claim 44 wherein said passive signal conditioning means comprises a passive signal conditioning device that includes a capacitor having at least three terminals, the capacitor characterized by frequencies at and below a specified self-resonant frequency (SRF) such that a corresponding ESR of said capacitor having at least three terminals satisfies said first substantial predetermined signal conditioning ESR and said ratio.

46. The method of claim 39 wherein said first substantial predetermined signal conditioning ESR falling within said predetermined range in ohms, corresponding to said one or more use frequencies falling within said predetermined frequency range of approximately 1 MHz and below, is between approximately 8 milliohms and 2 ohms.

47. The method of claim 46 wherein said passive signal conditioning means comprises a passive signal conditioning device that includes a capacitor having at least three terminals, the capacitor characterized by frequencies at and below a specified self-resonant frequency (SRF) such that a corresponding ESR of said capacitor having at least three terminals satisfies said first substantial predetermined signal conditioning ESR and said ratio.

48. The method of claim 39, further comprising:
providing at least one frequency domain filter part disposed farther than said passive signal conditioning means from said common connection junction of said output and feedback paths and said rails, connected in parallel alongside said passive signal conditioning means, and characterized by (i) a predetermined filter SRF, (ii) a corresponding predetermined filter ESR corresponding to said one or more use frequencies at and below said predetermined filter SRF such that a ratio of said first substantial predetermined signal conditioning ESR to said corresponding predetermined filter ESR is greater than 1, and (iii) further attenuation, in at least said specified low frequency band of said frequency domain noise, greater than in a case in which said frequency domain filter part is not connected, so as to make attenuation of said frequency domain noise, in said combined range of said specified low frequency band and said specified high frequency band, greater than in a case in which said frequency domain filter part is not connected and to make said combined range of said specified low frequency band and said specified high frequency band greater than 100 MHz.

49. The method of claim 48 wherein said frequency domain filter part comprises at least three terminals.

50. The method of claim 48 wherein said passive signal conditioning means comprises a passive signal conditioning device that includes a capacitor having at least three terminals, the capacitor characterized by frequencies at and below a specified self-resonant frequency (SRF) such that a corresponding ESR of said capacitor having at least three terminals satisfies said first substantial predetermined signal conditioning ESR and said ratio.

51. The method of claim 50 wherein said frequency domain filter part comprises at least three terminals.

52. The method of claim 50 wherein said output signal is DC.

53. The method of claim 39 wherein said feedback control loop circuitry including said first switching block means is a switch mode power supply.

* * * * *